(12) United States Patent
Mine

(10) Patent No.: US 9,391,120 B2
(45) Date of Patent: Jul. 12, 2016

(54) SEMICONDUCTOR MEMORY DEVICE HAVING UNEQUAL PITCH VERTICAL CHANNEL TRANSISTORS USED AS SELECTION TRANSISTORS

(71) Applicant: SanDisk 3D LLC, Milpitas, CA (US)

(72) Inventor: Teruyuki Mine, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 13 days.

(21) Appl. No.: 14/449,417

(22) Filed: Aug. 1, 2014

(65) Prior Publication Data

US 2016/0035789 A1    Feb. 4, 2016

(51) Int. Cl.
| | |
|---|---|
| G11C 13/00 | (2006.01) |
| H01L 27/24 | (2006.01) |
| H01L 45/00 | (2006.01) |
| H01L 21/8234 | (2006.01) |
| H01L 21/768 | (2006.01) |

(52) U.S. Cl.
CPC .......... *H01L 27/249* (2013.01); *G11C 13/0069* (2013.01); *H01L 21/768* (2013.01); *H01L 21/823487* (2013.01); *H01L 27/2454* (2013.01); *H01L 45/1233* (2013.01); *H01L 45/1253* (2013.01); *H01L 45/16* (2013.01); *G11C 2013/009* (2013.01); *G11C 2213/71* (2013.01)

(58) Field of Classification Search
CPC ...... G11C 5/025; G11C 5/02; G11C 11/5678; G11C 11/5685; G11C 13/0004; G11C 13/0007; G11C 2213/52; G11C 2213/50; G11C 2213/71; G11C 2213/75; G11C 2213/78; G11C 2213/79; H01L 29/7926; H01L 29/8083; H01L 45/1233
See application file for complete search history.

(56) References Cited

U.S. PATENT DOCUMENTS

| | | | |
|---|---|---|---|
| 7,177,191 B2* | 2/2007 | Fasoli | H01L 27/11551 257/E27.103 |
| 7,564,084 B2 | 7/2009 | Song et al. | |
| 7,968,876 B2* | 6/2011 | Lung | H01L 27/101 257/328 |
| 8,488,381 B2* | 7/2013 | Kim | G11C 16/0483 365/185.11 |
| 9,111,620 B2* | 8/2015 | Tanzawa | G11C 16/08 |
| 2002/0034855 A1 | 3/2002 | Horiguchi et al. | |
| 2007/0051994 A1 | 3/2007 | Song et al. | |
| 2012/0147648 A1 | 6/2012 | Scheuerlein | |
| 2013/0258745 A1 | 10/2013 | Tanzawa | |

* cited by examiner

*Primary Examiner* — Andrew Q Tran
(74) *Attorney, Agent, or Firm* — Vierra Magen Marcus LLP

(57) ABSTRACT

A semiconductor device comprises a set of selection transistors, such as in a three-dimensional memory structure or stack having resistance change memory cells arranged along vertical bit lines. Each selection transistor has a non-shared control gate and a shared control gate. The transistor bodies may have an unequal pitch and a common height. Some of the transistor bodies can be misaligned with the vertical bit lines to fit the transistors to the stack. A method for programming the three-dimensional memory structure includes forming one or two channels in a transistor body to provide a current to selected memory cells. Programming can initially use one channel and subsequently use two channels based on a programming progress. A method for fabricating a semiconductor device includes etching a gate conductor material so that shared and non-shared control gates have a common height.

14 Claims, 31 Drawing Sheets

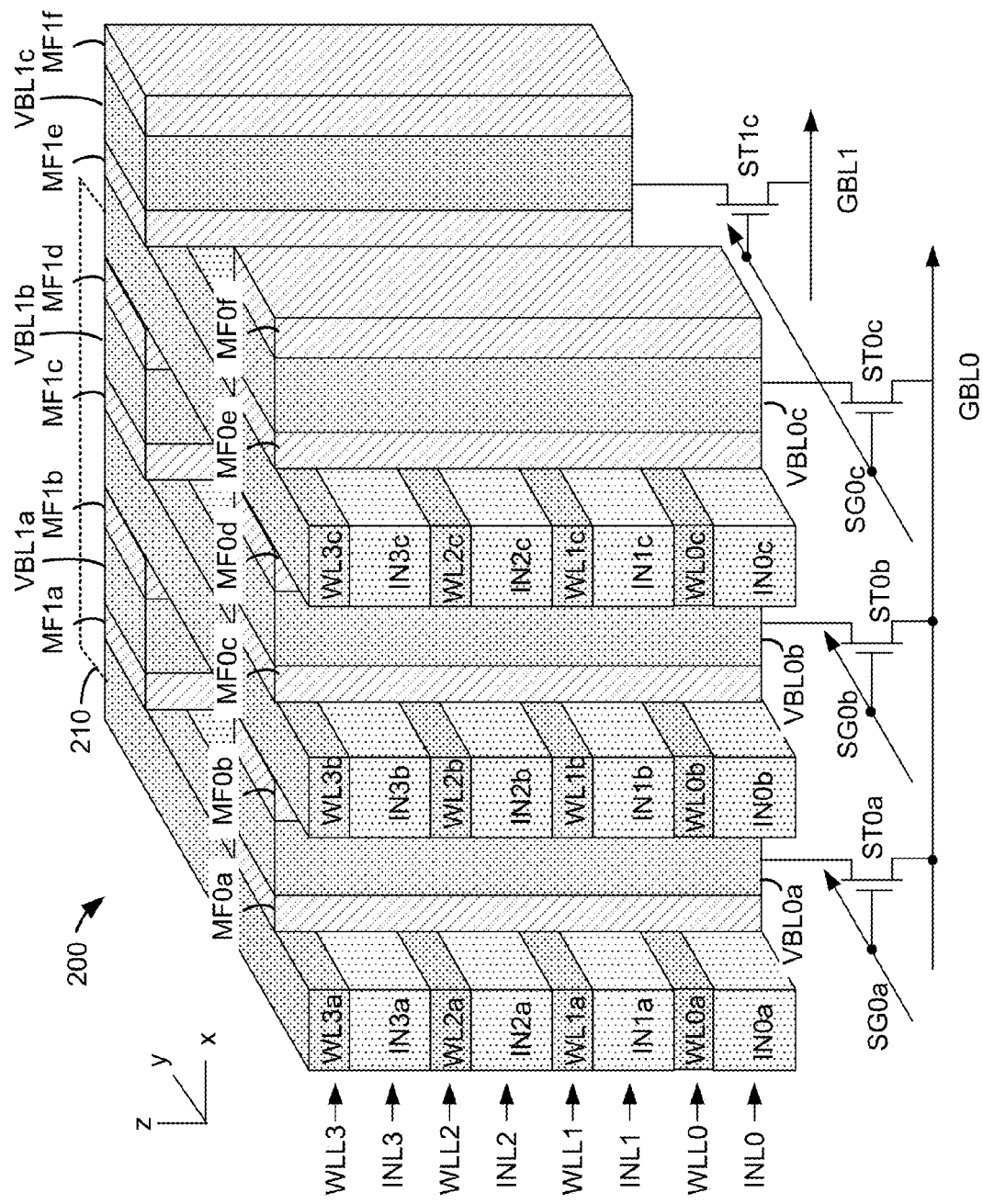

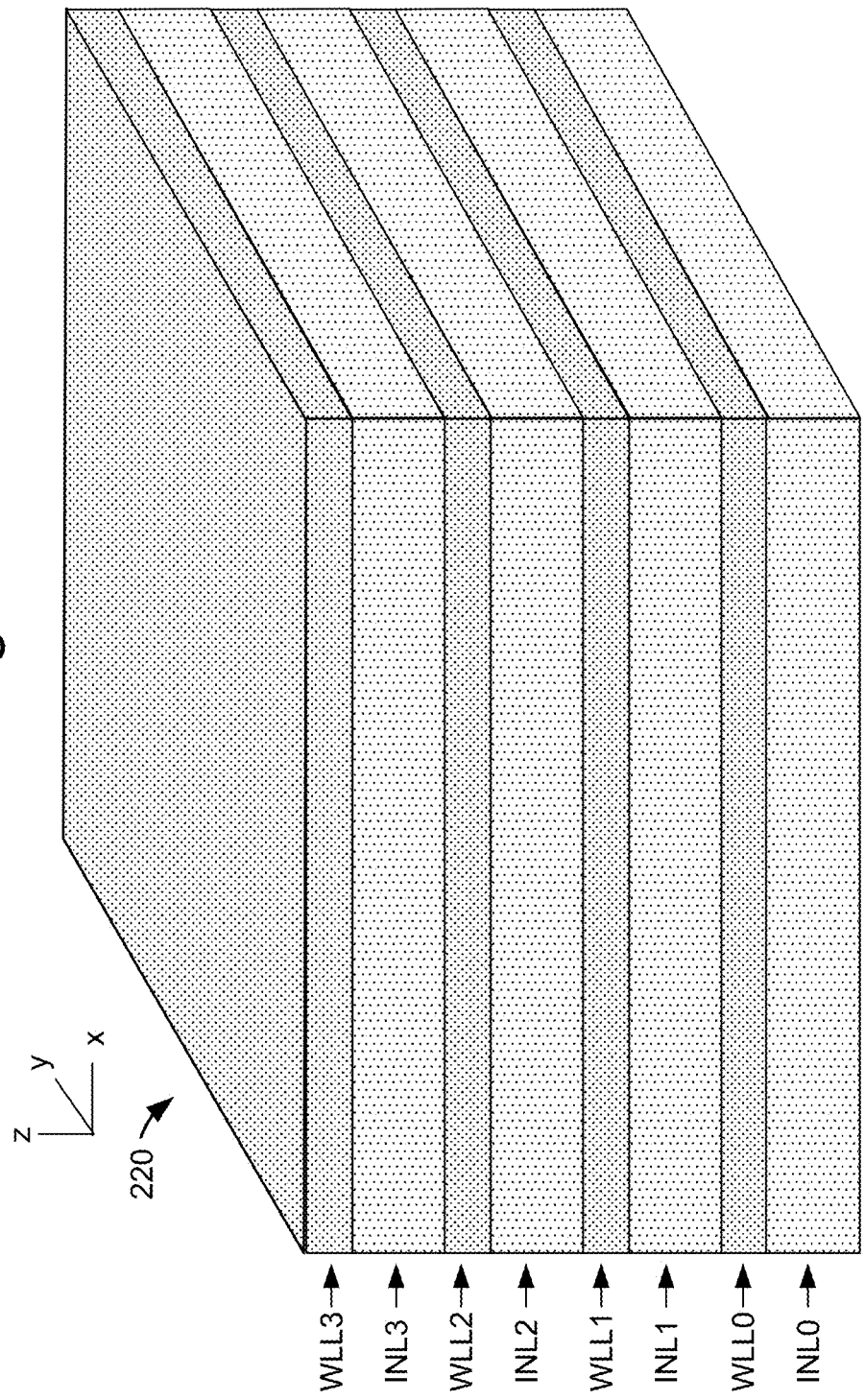

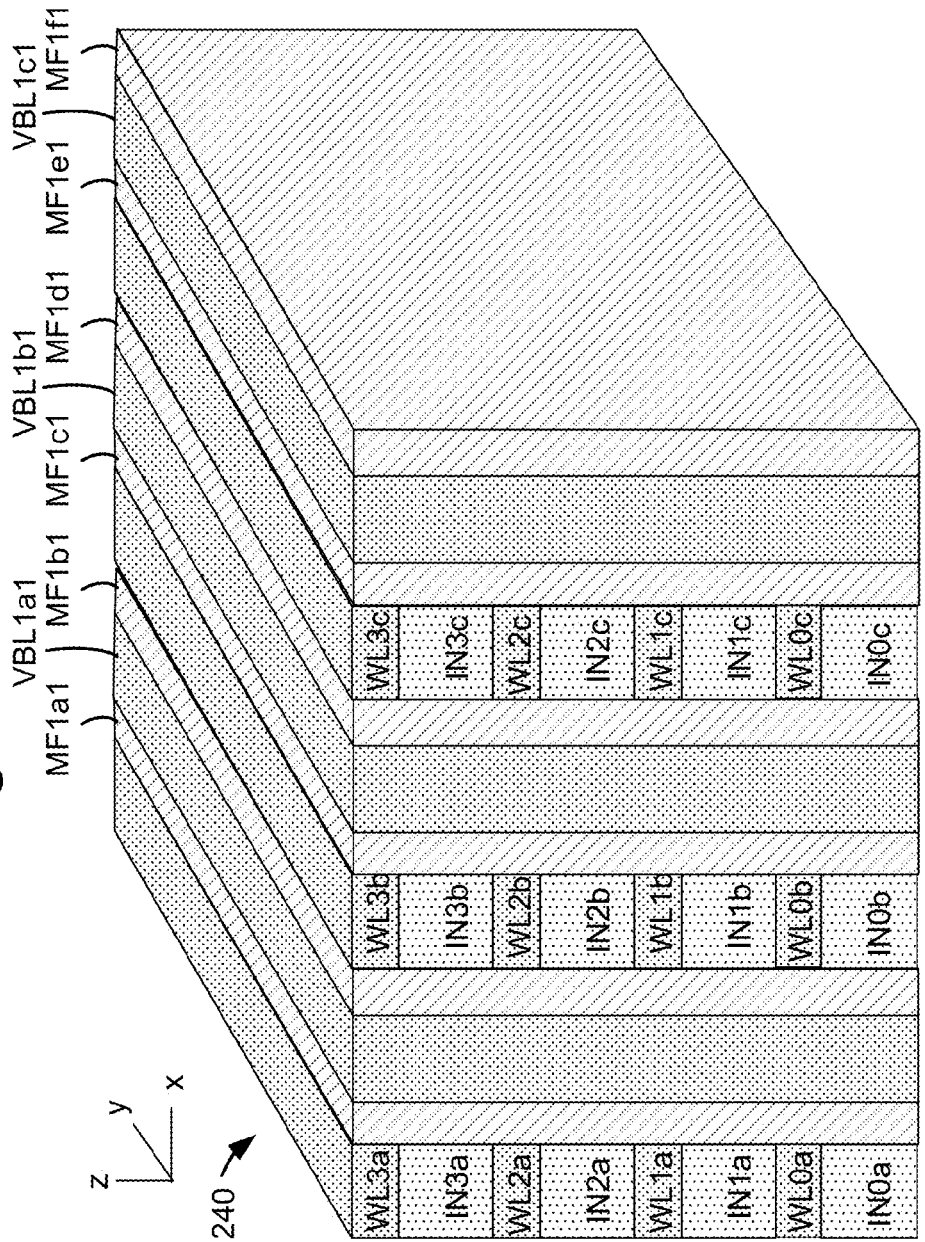

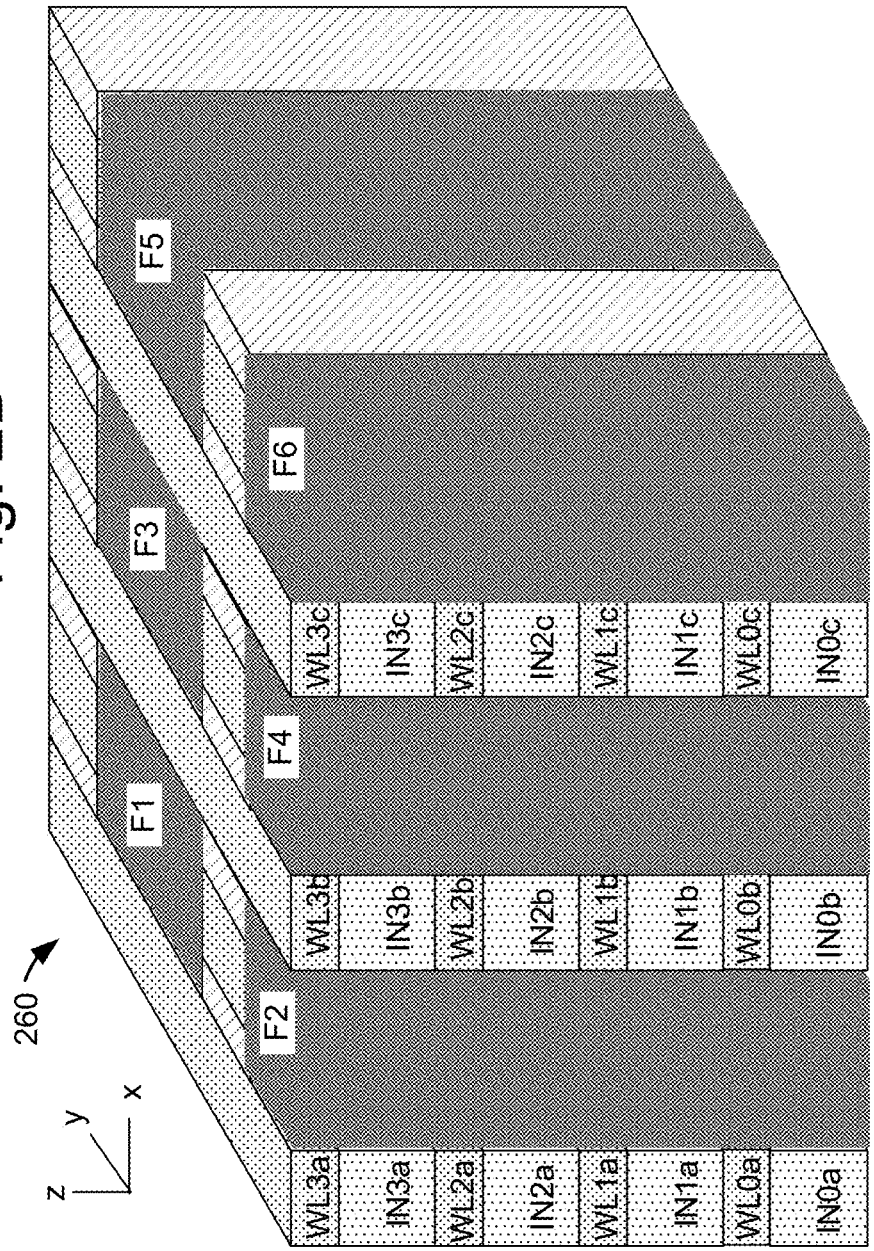

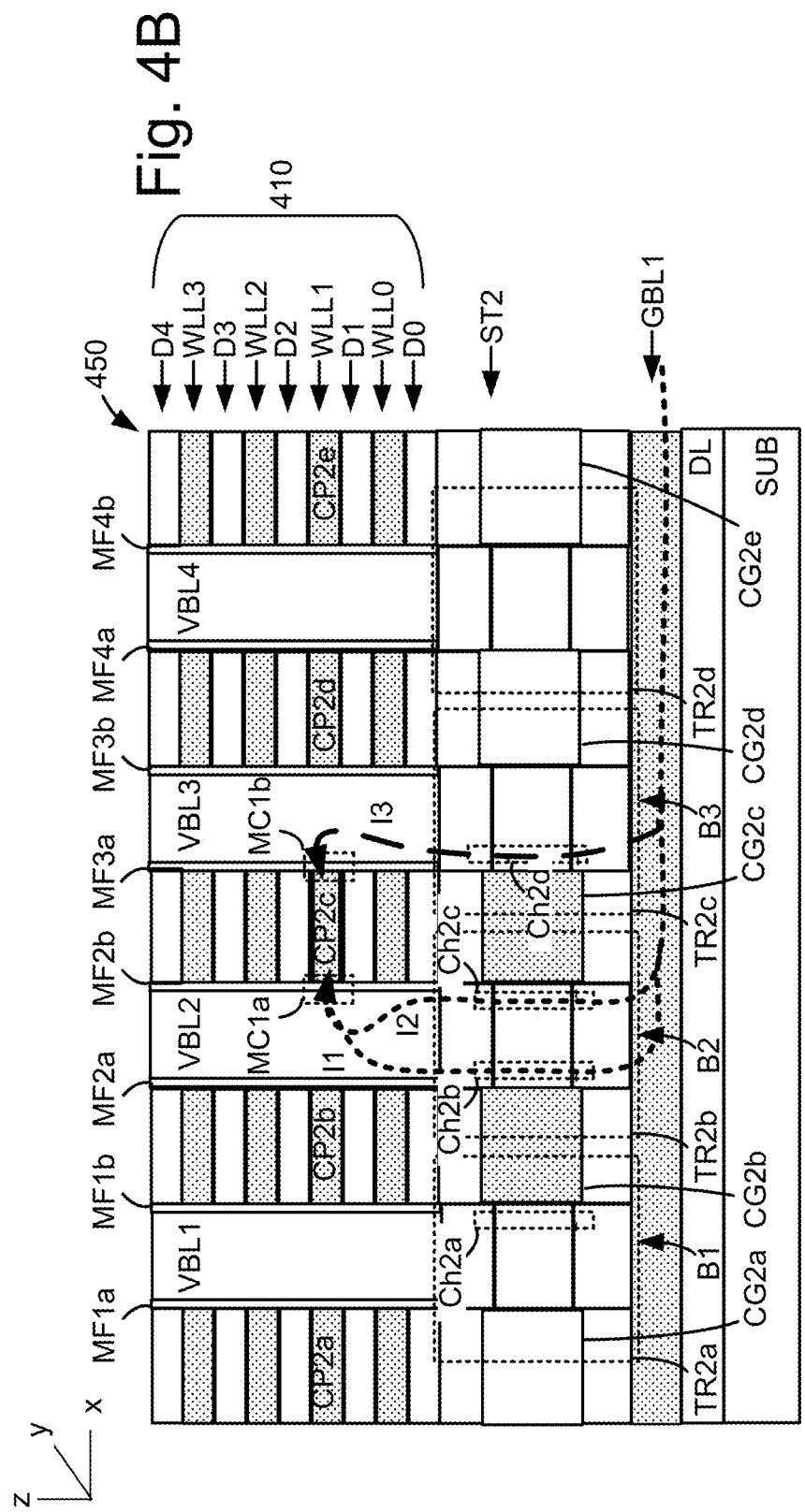

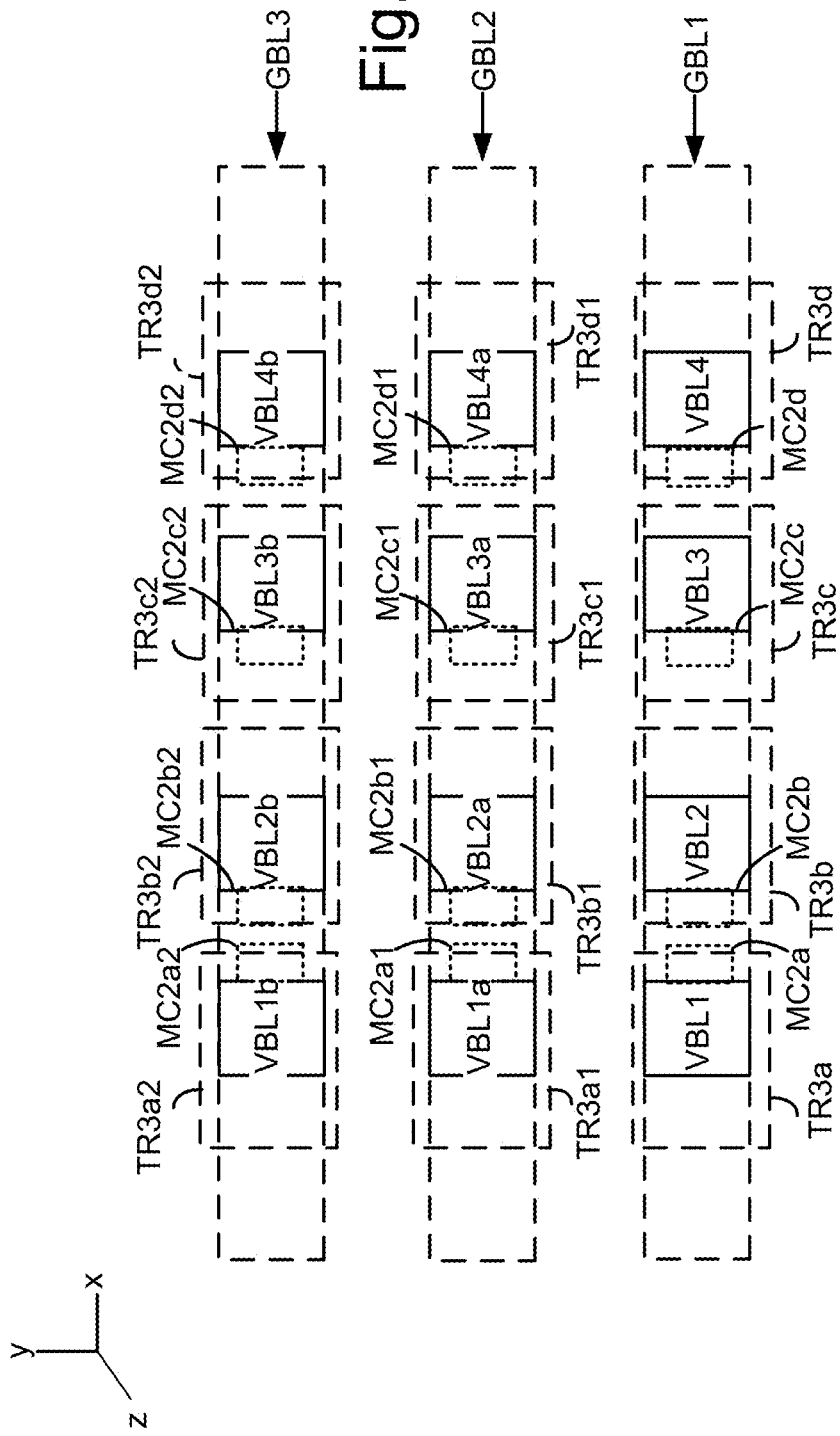

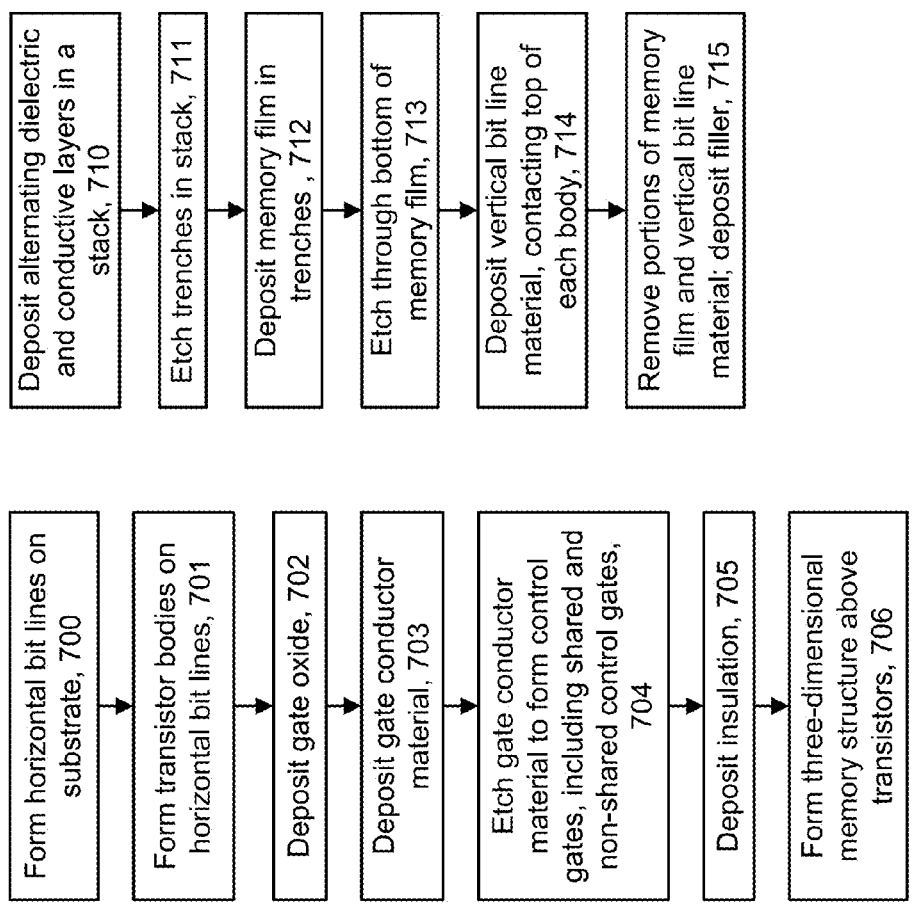

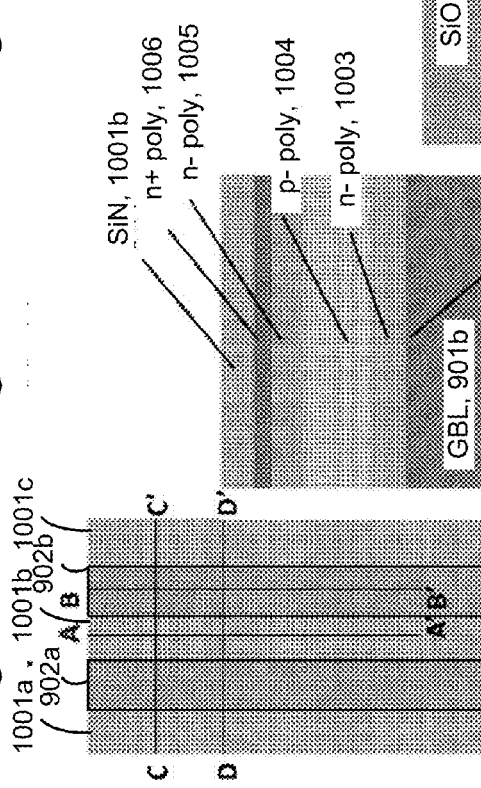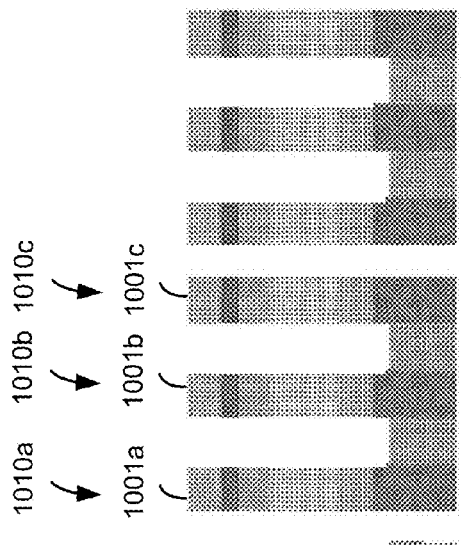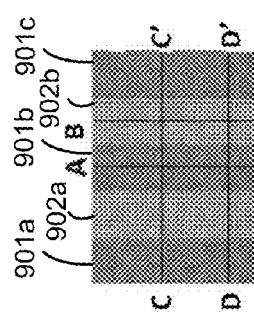

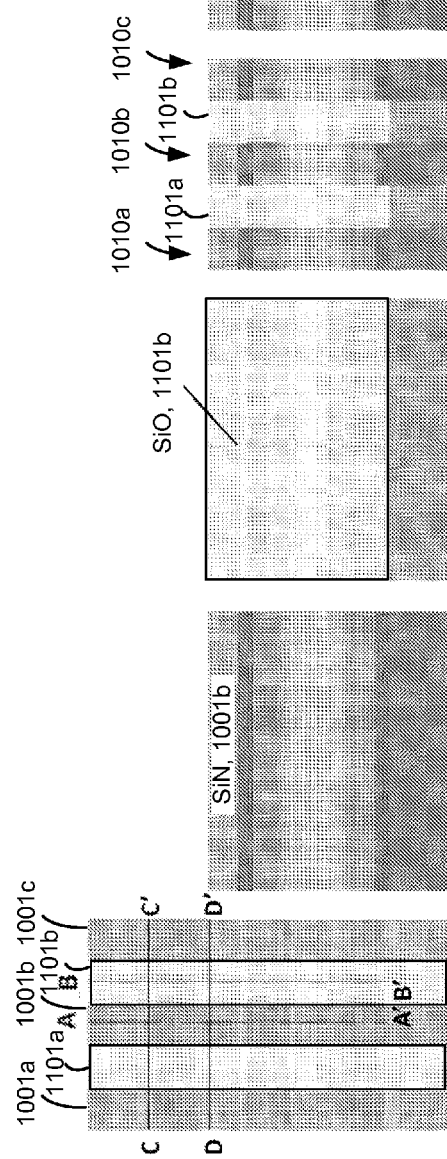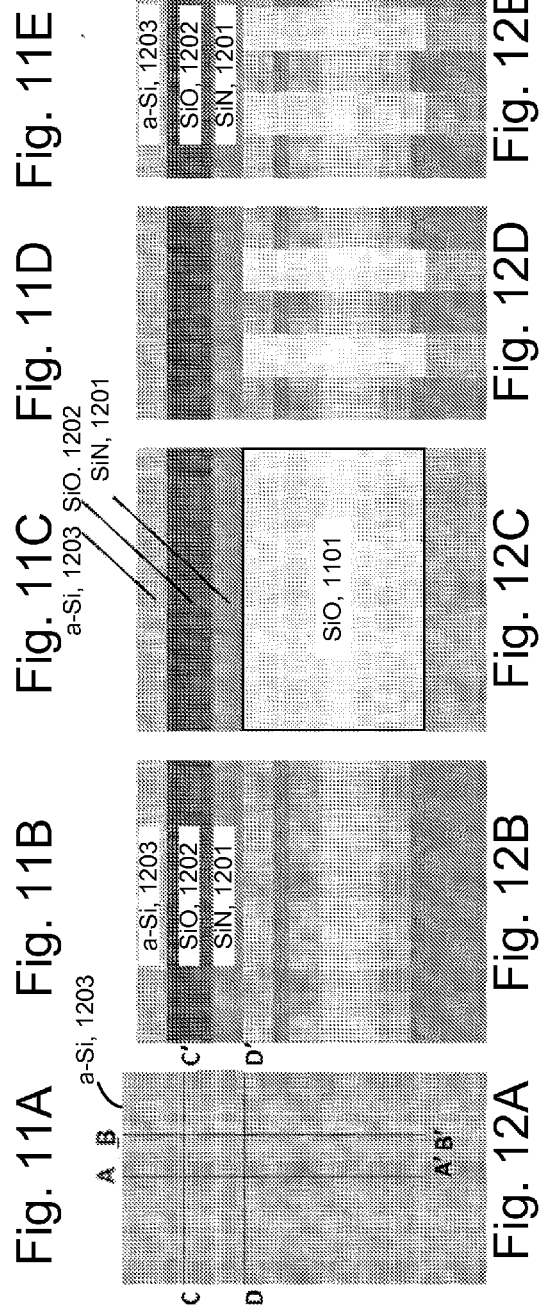

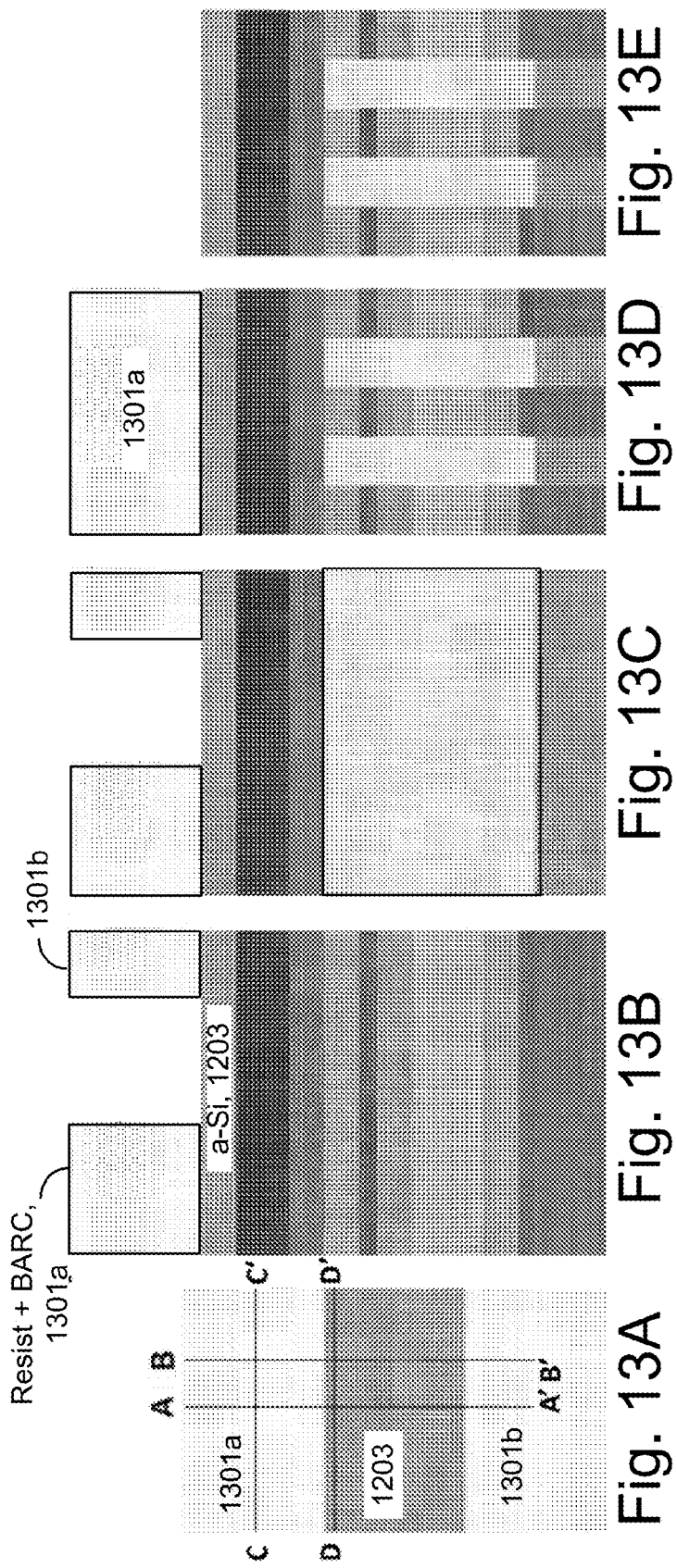

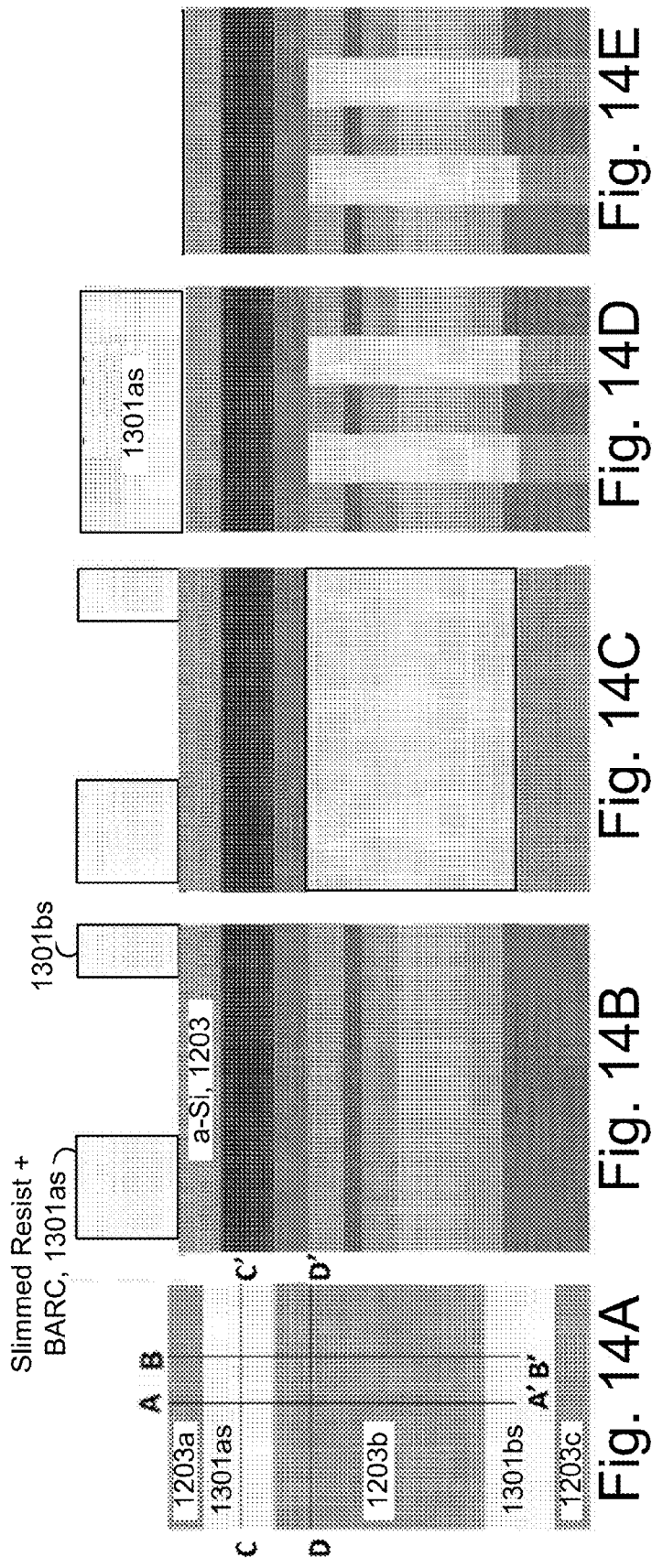

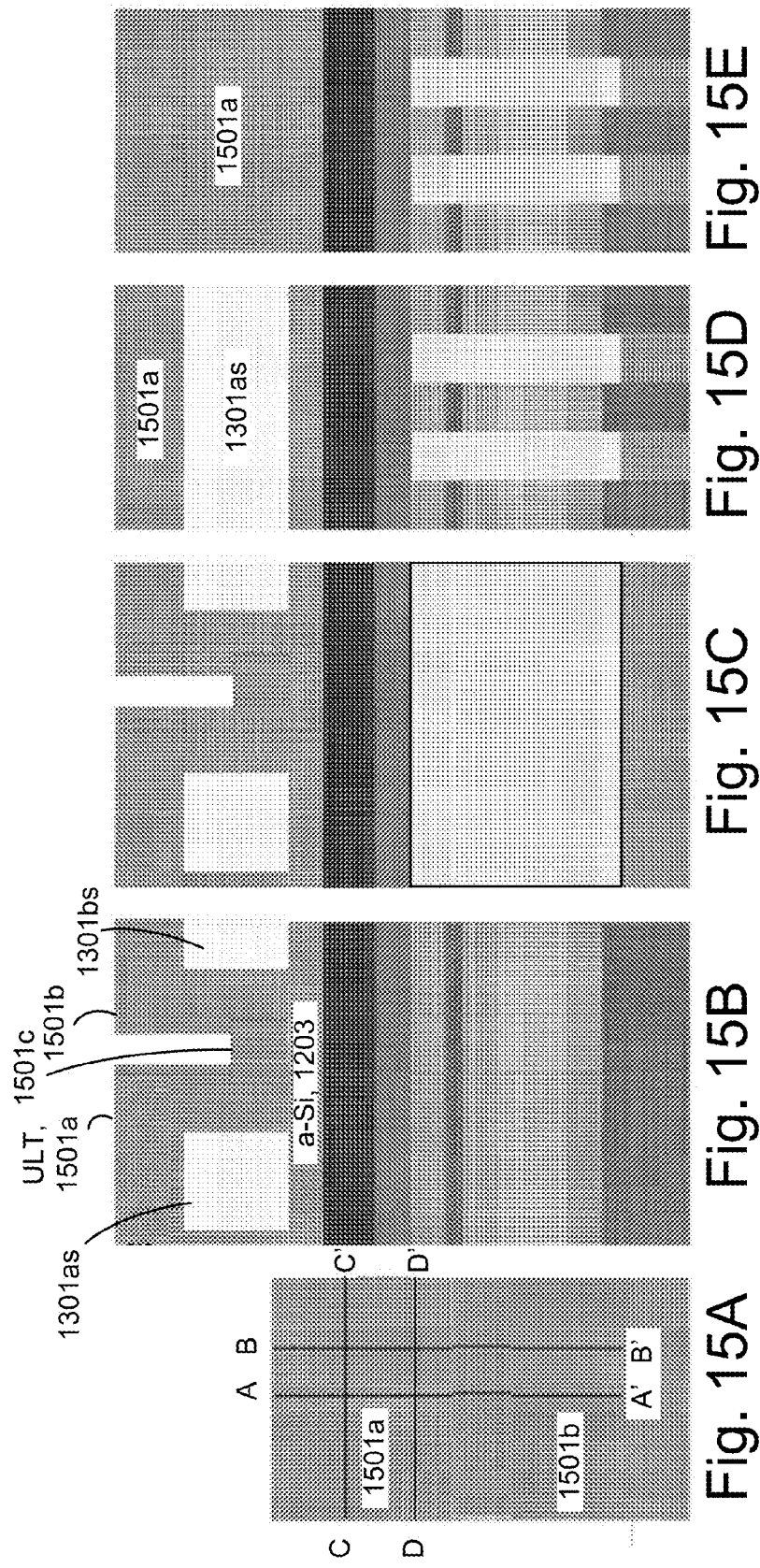

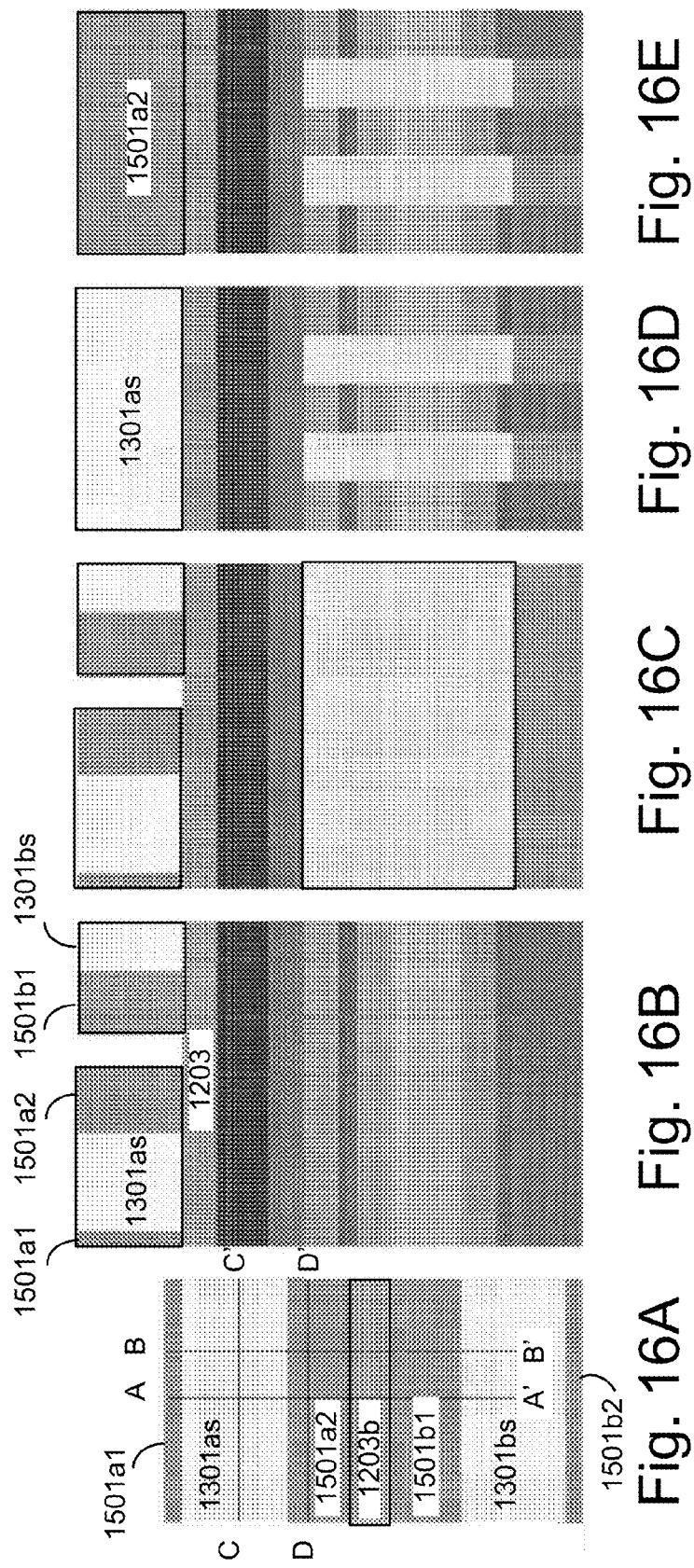

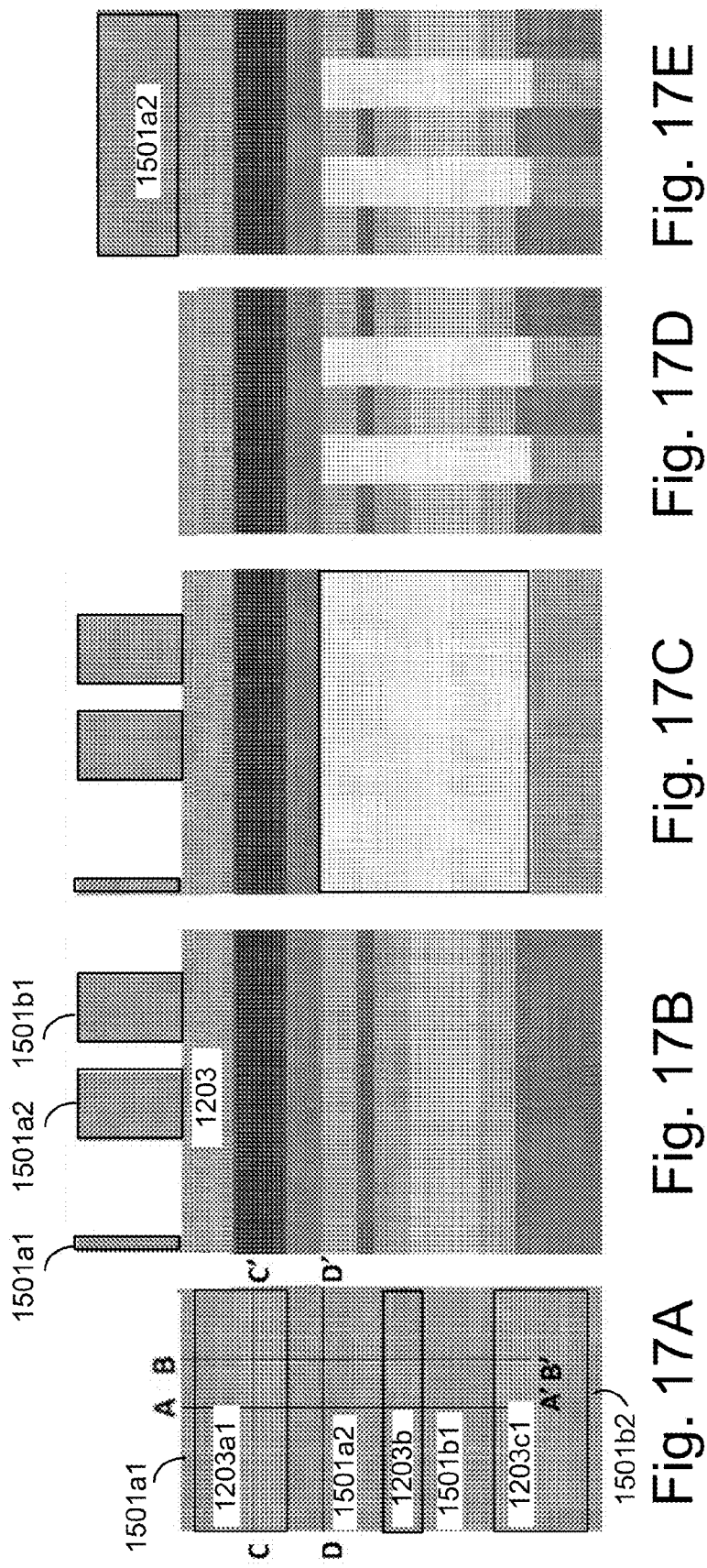

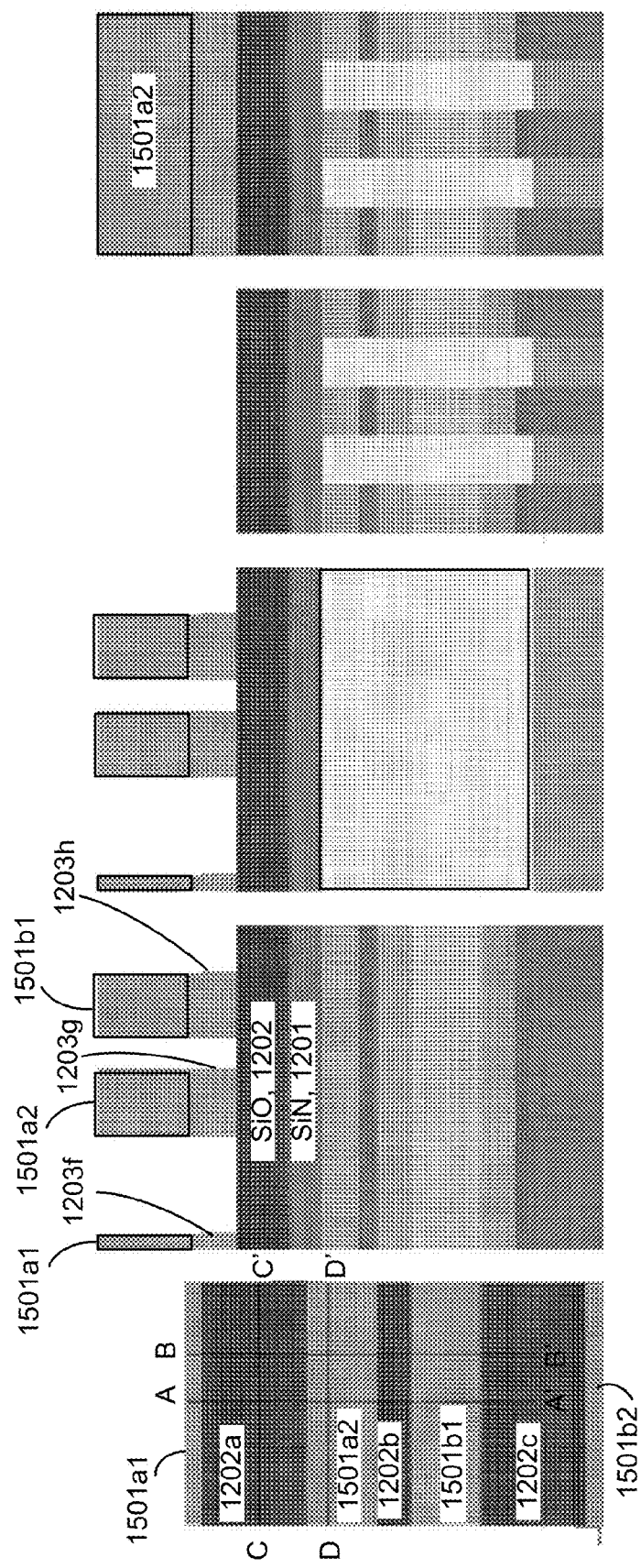

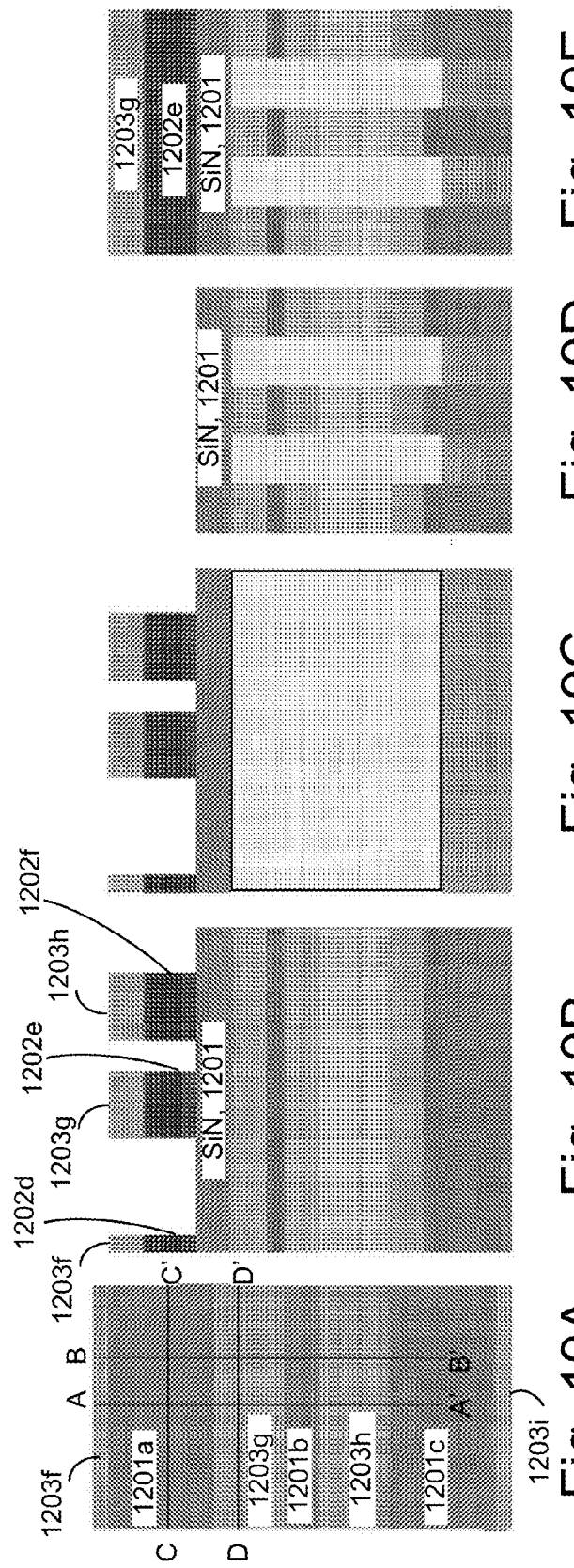

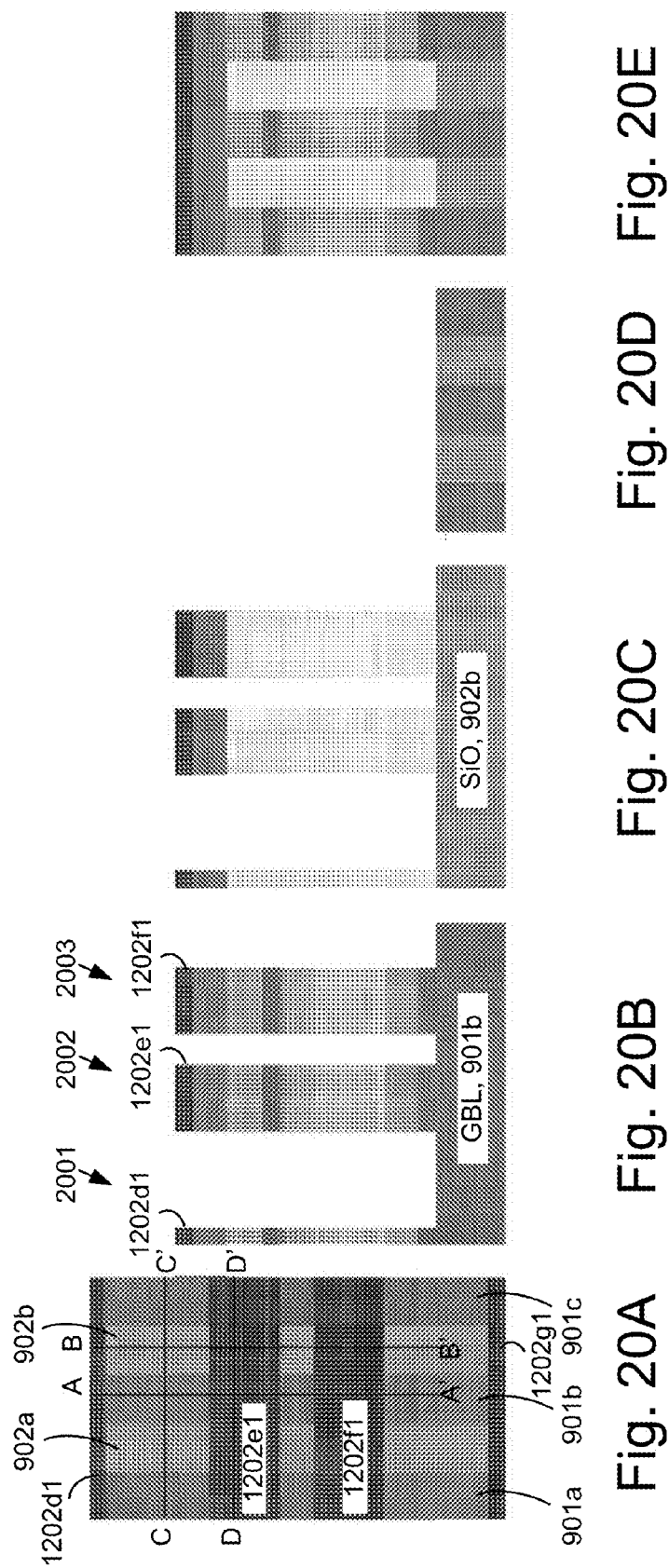

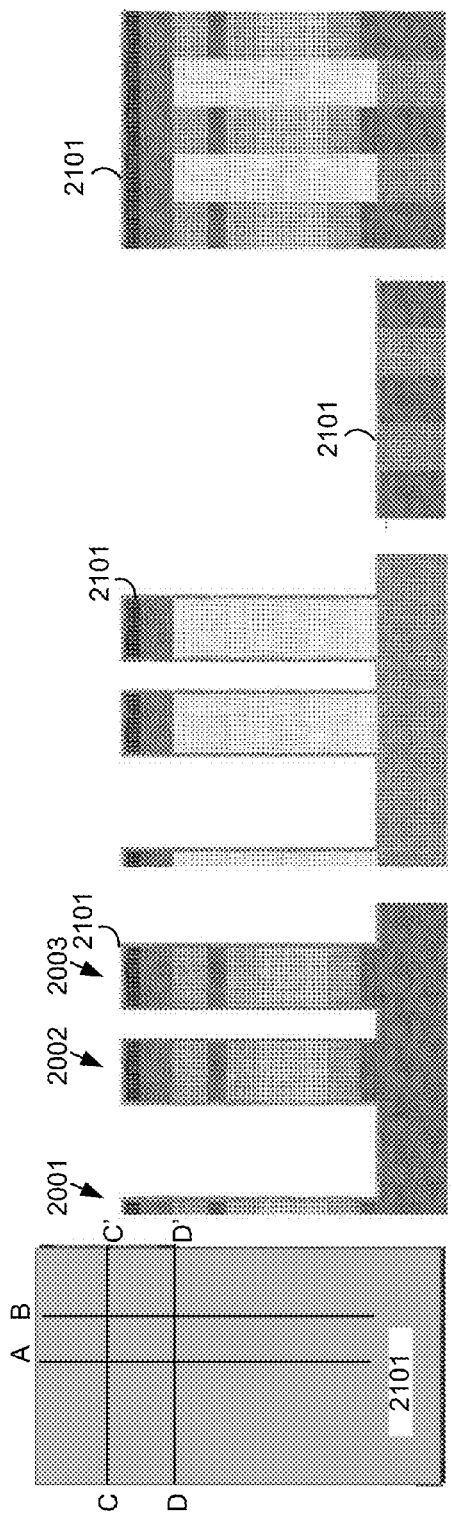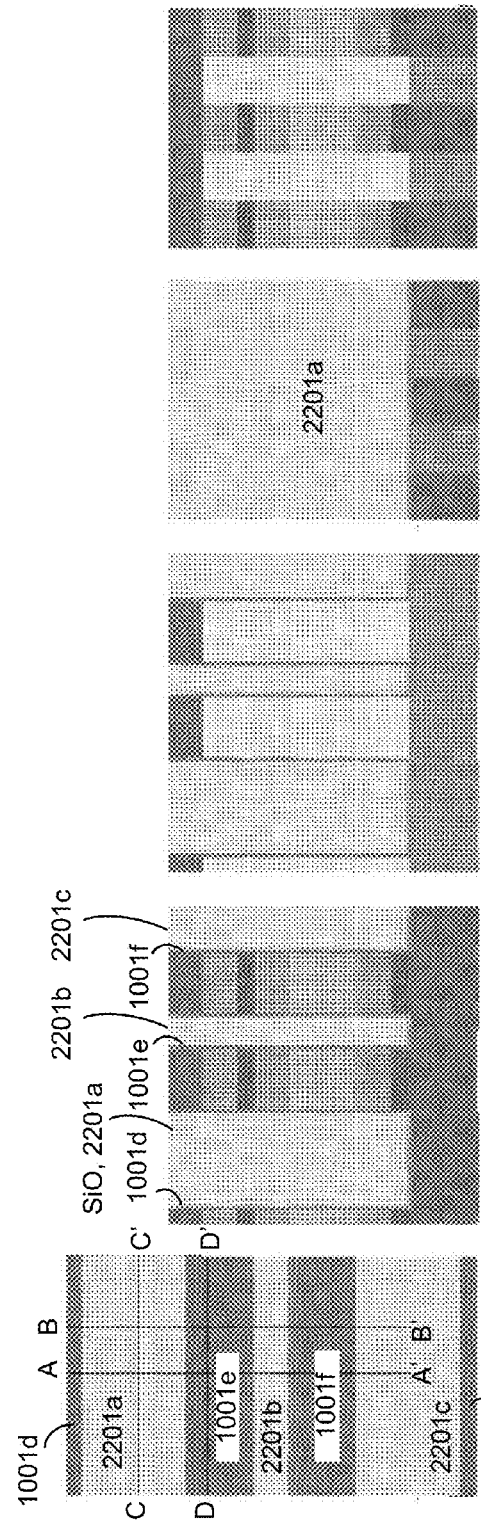

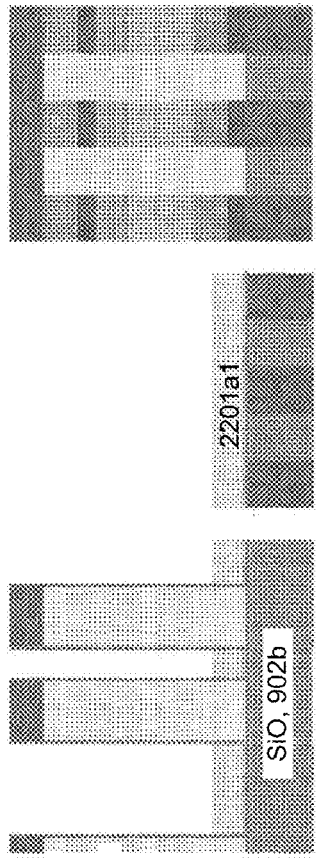
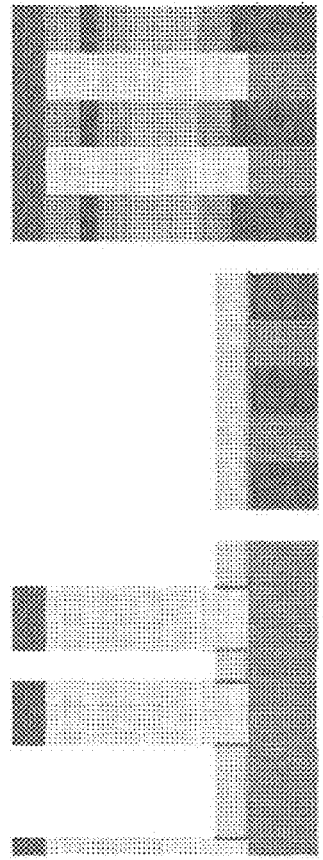
Fig. 23A–23E
Fig. 24A–24E

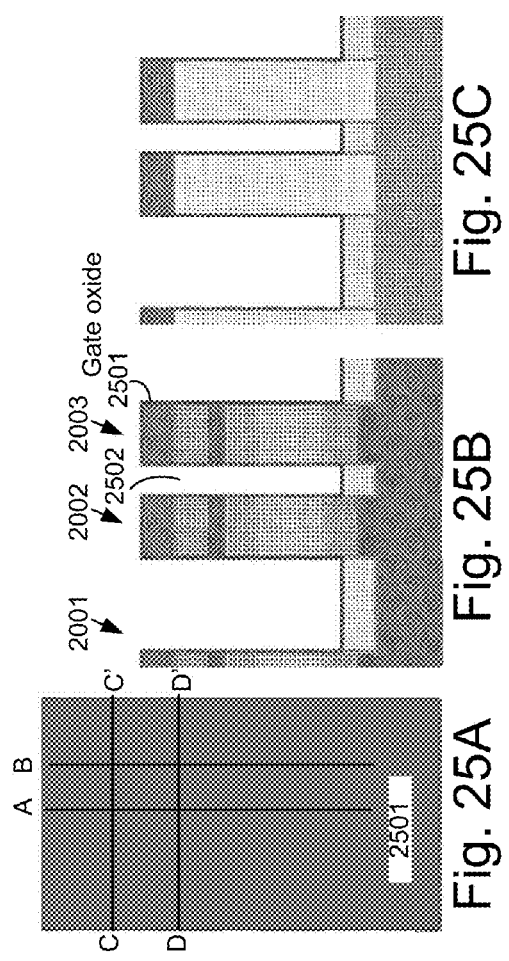
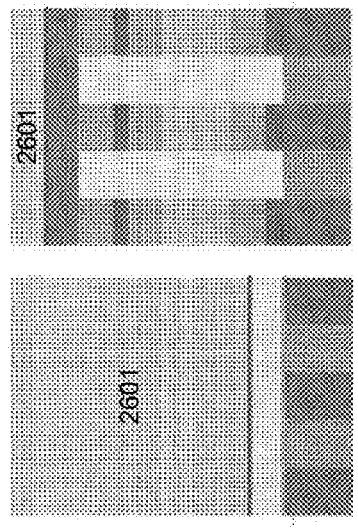
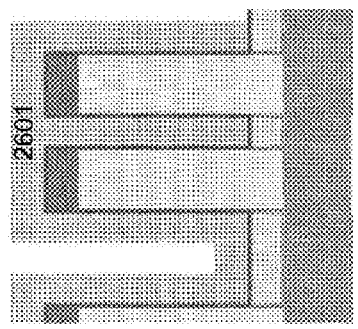
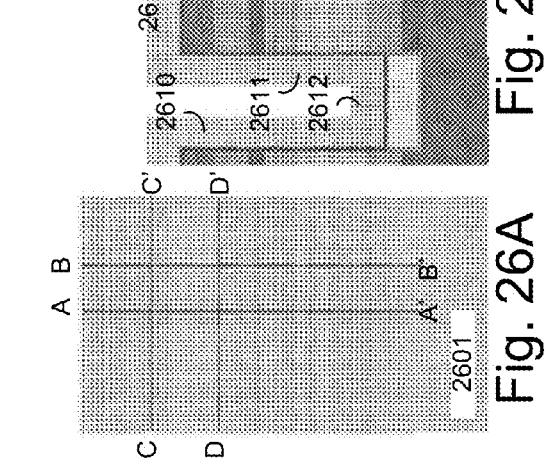

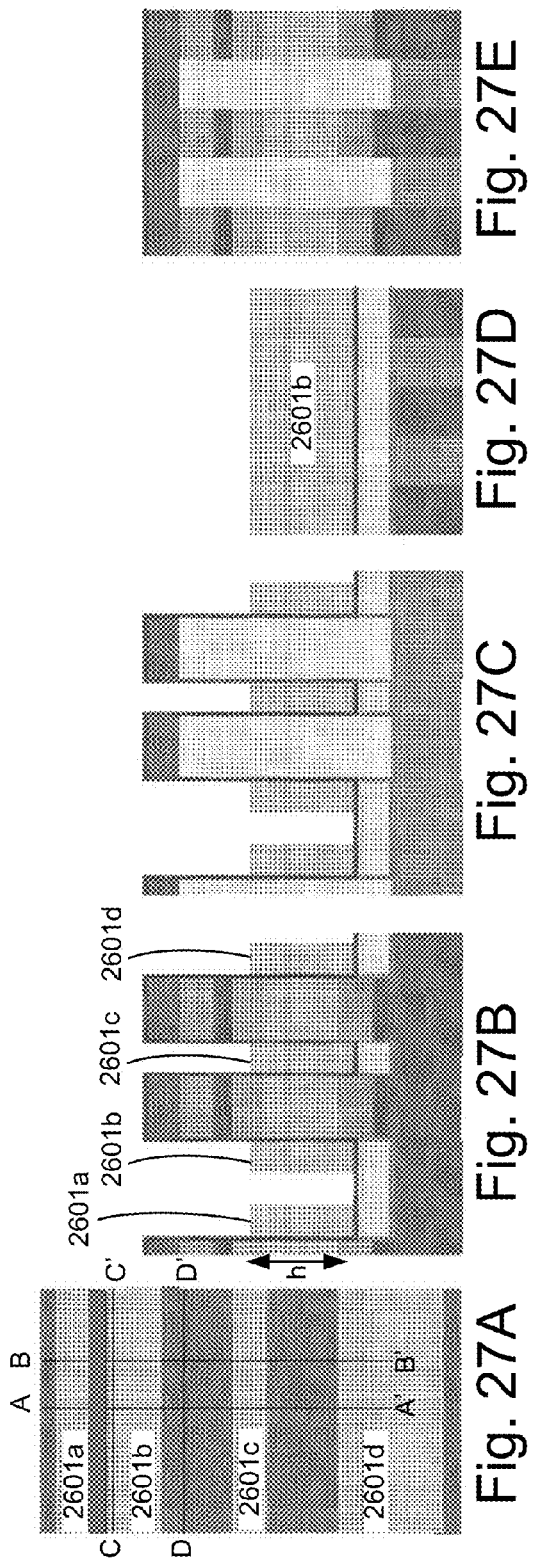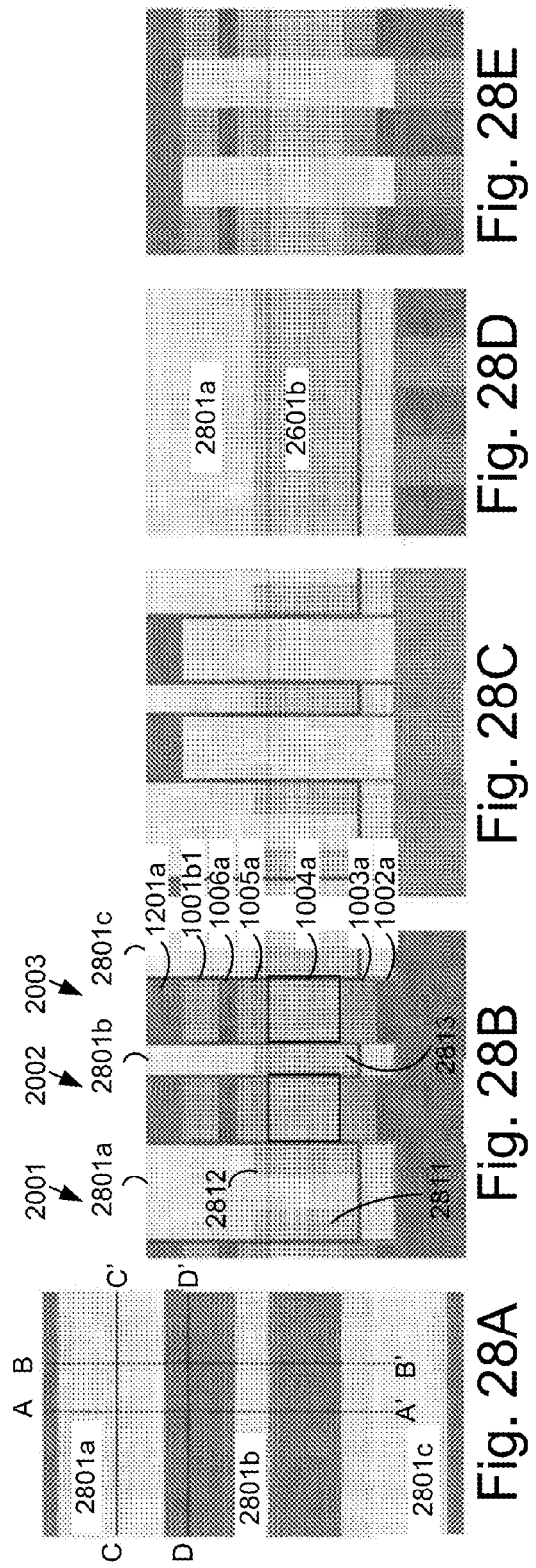

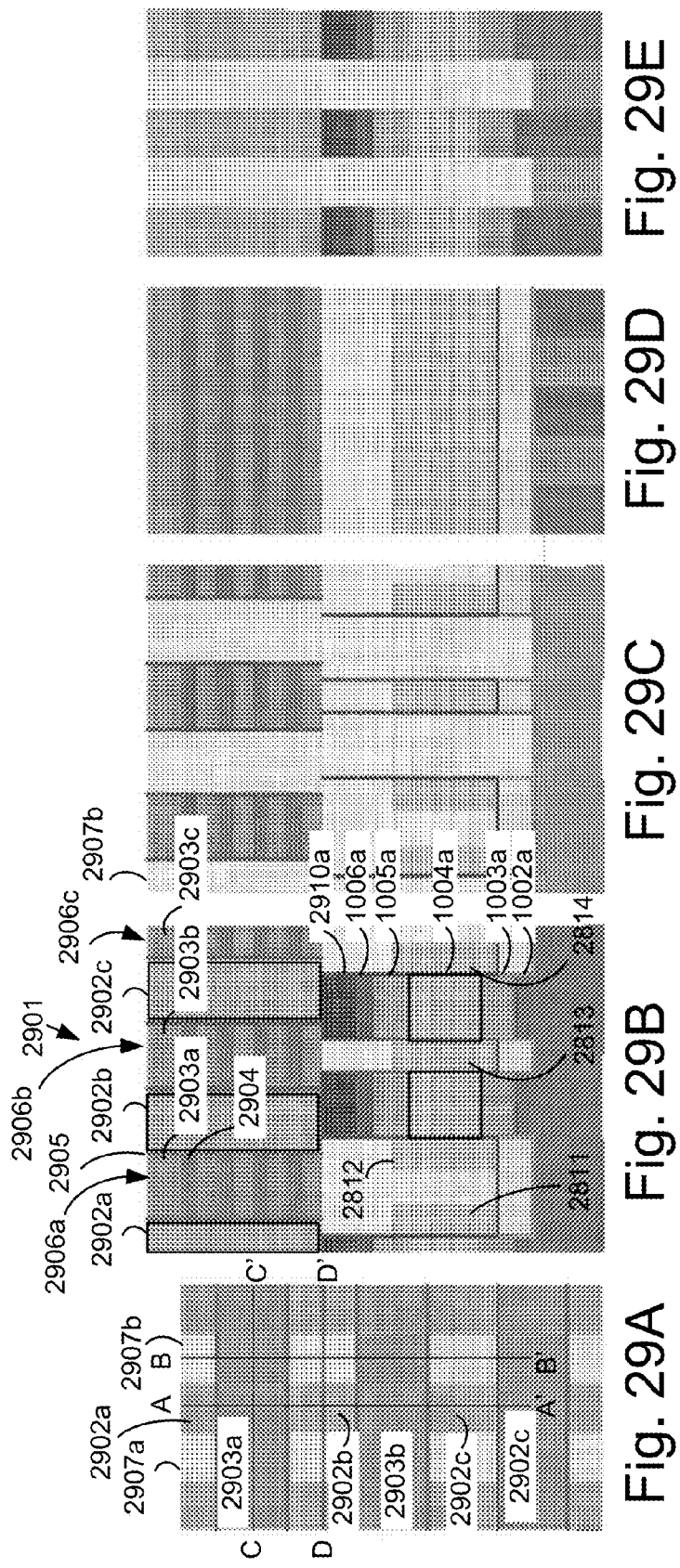

SEMICONDUCTOR MEMORY DEVICE HAVING UNEQUAL PITCH VERTICAL CHANNEL TRANSISTORS USED AS SELECTION TRANSISTORS

BACKGROUND

The present technology relates to a semiconductor device comprising a set of vertical channel transistors, to a fabrication process for such a semiconductor device and to a method for controlling such a device.

Vertical channel transistors may be fabricated from layers of thin films, and can be used in various applications. For example, these transistors can be used as bit line selection transistors in a vertical bit line (VBL) memory device. A VBL memory device can include a resistance-change memory film which exhibits resistance-switching behavior, in which the resistance of the material is a function of the history of the current through, and/or voltage across, the memory film. The memory film can extend vertically along sides of trenches in a stack. The stack comprises alternating word line layers and dielectric layers, where rows of spaced apart vertical bit lines are formed. A memory cell is formed by the intersection of each word line layer with the memory film. A vertical channel transistor can be provided below each vertical bit line to control the flow of current to the bit line from a global bit line which is below the vertical channel transistor, such as during a read or program operation.

BRIEF DESCRIPTION OF THE DRAWINGS

FIG. 2A depicts a three-dimensional memory structure 200 as an example of the memory cell array 103 of FIG. 1.

FIG. 2B depicts a stack 220 of alternating conductive layers and dielectric layers used to form the three-dimensional memory structure 200 of FIG. 2A.

FIG. 2C depicts a structure 240 which is obtained by etching trenches in the y-direction in the stack 220 of FIG. 2A, and filling the trenches with memory films MF1a1, MF1b1, MF1c1, MF1d1, MF1e1 and MF1f1, and vertical bit line material VBL1a1, VBL1b1 and VBL1c1.

FIG. 2D depicts a structure 260 which is obtained by etching away portions of the memory films and vertical bit line material to form voids and depositing a insulating filler F1-F6 in the voids.

FIG. 4B depicts another example implementation of a set of selection transistors, where each selection transistor has shared control gates.

FIG. 5C depicts a top view of a set of vertical bit lines and selection transistors consistent with FIGS. 5A and 5B.

FIG. 7A depicts a process for fabricating a memory device such as in FIG. 2A to 6B.

FIG. 7B depicts a process for performing step 706 of FIG. 7A.

FIG. 9A to 29E depicts an example of a fabrication process consistent with FIG. 7A.

FIG. 9A depicts a top view of a semiconductor material in a first step of a fabrication process, and FIGS. 9B, 9C, 9D and 9E depict views along cross-sections A-A', B-B', C-C' and D-D', respectively, of FIG. 9A.

FIG. 10A depicts a top view of a semiconductor material in a next step of the fabrication process, and FIGS. 10B, 10C, 10D and 10E depict views along cross-sections A-A', B-B', C-C' and D-D', respectively, of FIG. 10A.

FIG. 11A depicts a top view of a semiconductor material in a next step of the fabrication process, and FIGS. 11B, 11C, 11D and 11E depict views along cross-sections A-A', B-B', C-C' and D-D', respectively, of FIG. 11A.

FIG. 12A depicts a top view of a semiconductor material in a next step of the fabrication process, and FIGS. 12B, 12C, 12D and 12E depict views along cross-sections A-A', B-B', C-C' and D-D', respectively, of FIG. 12A.

FIG. 13A depicts a top view of a semiconductor material in a next step of the fabrication process, and FIGS. 13B, 13C, 13D and 13E depict views along cross-sections A-A', B-B', C-C' and D-D', respectively, of FIG. 13A.

FIG. 14A depicts a top view of a semiconductor material in a next step of the fabrication process, and FIGS. 14B, 14C, 14D and 14E depict views along cross-sections A-A', B-B', C-C' and D-D', respectively, of FIG. 14A.

FIG. 15A depicts a top view of a semiconductor material in a next step of the fabrication process, and FIGS. 15B, 15C, 15D and 15E depict views along cross-sections A-A', B-B', C-C' and D-D', respectively, of FIG. 15A.

FIG. 16A depicts a top view of a semiconductor material in a next step of the fabrication process, and FIGS. 16B, 16C, 16D and 16E depict views along cross-sections A-A', B-B', C-C' and D-D', respectively, of FIG. 16A.

FIG. 17A depicts a top view of a semiconductor material in a next step of the fabrication process, and FIGS. 17B, 17C, 17D and 17E depict views along cross-sections A-A', B-B', C-C' and D-D', respectively, of FIG. 17A.

FIG. 18A depicts a top view of a semiconductor material in a next step of the fabrication process, and FIGS. 18B, 18C, 18D and 18E depict views along cross-sections A-A', B-B', C-C' and D-D', respectively, of FIG. 18A.

FIG. 19A depicts a top view of a semiconductor material in a next step of the fabrication process, and FIGS. 19B, 19C, 19D and 19E depict views along cross-sections A-A', B-B', C-C' and D-D', respectively, of FIG. 19A.

FIG. 20A depicts a top view of a semiconductor material in a next step of the fabrication process, and FIGS. 20B, 20C, 20D and 20E depict views along cross-sections A-A', B-B', C-C' and D-D', respectively, of FIG. 20A.

FIG. 21A depicts a top view of a semiconductor material in a next step of the fabrication process, and FIGS. 21B, 21C, 21D and 21E depict views along cross-sections A-A', B-B', C-C' and D-D', respectively, of FIG. 21A.

FIG. 22A depicts a top view of a semiconductor material in a next step of the fabrication process, and FIGS. 22B, 22C, 22D and 22E depict views along cross-sections A-A', B-B', C-C' and D-D', respectively, of FIG. 22A.

FIG. 23A depicts a top view of a semiconductor material in a next step of the fabrication process, and FIGS. 23B, 23C, 23D and 23E depict views along cross-sections A-A', B-B', C-C' and D-D', respectively, of FIG. 23A.

FIG. 24A depicts a top view of a semiconductor material in a next step of the fabrication process, and FIGS. 24B, 24C, 24D and 24E depict views along cross-sections A-A', B-B', C-C' and D-D', respectively, of FIG. 24A.

FIG. 25A depicts a top view of a semiconductor material in a next step of the fabrication process, and FIGS. 25B, 25C, 25D and 25E depict views along cross-sections A-A', B-B', C-C' and D-D', respectively, of FIG. 25A.

FIG. 26A depicts a top view of a semiconductor material in a next step of the fabrication process, and FIGS. 26B, 26C, 26D and 26E depict views along cross-sections A-A', B-B', C-C' and D-D', respectively, of FIG. 26A.

FIG. 27A depicts a top view of a semiconductor material in a next step of the fabrication process, and FIGS. 27B, 27C, 27D and 27E depict views along cross-sections A-A', B-B', C-C' and D-D', respectively, of FIG. 27A.

FIG. 28A depicts a top view of a semiconductor material in a next step of the fabrication process, and FIGS. 28B, 28C, 28D and 28E depict views along cross-sections A-A', B-B', C-C' and D-D', respectively, of FIG. 28A.

FIG. 29A depicts a top view of a semiconductor material in a next step of the fabrication process, and FIGS. 29B, 29C, 29D and 29E depict views along cross-sections A-A', B-B', C-C' and D-D', respectively, of FIG. 29A.

DETAILED DESCRIPTION

Figure 1:
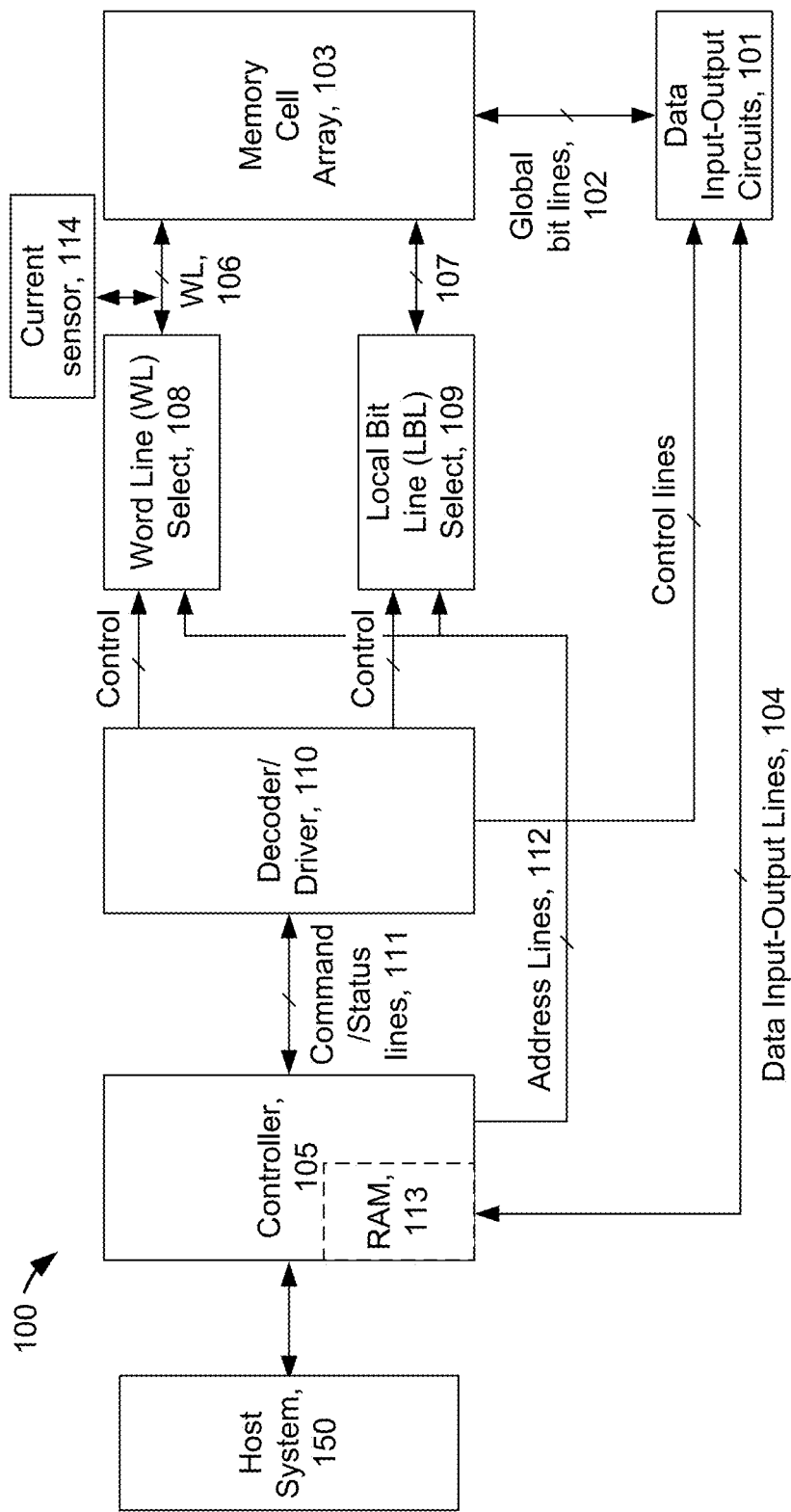
FIG. 1 is a schematic block diagram of a re-programmable non-volatile memory system connected to a host system.

Vertical channel transistors can be used in a variety of semiconductor devices. One example is the use of a set of vertical channel transistors as bit line selection transistors in a vertical bit line (VBL) memory device. A vertical channel transistor includes a body and one or more control gates. The body includes a drain region, a source region and a channel region between the drain and source regions. The control gate is spaced apart from the body by a gate insulator material and extends along the side of the body, from the drain region to the source region. Further, the control gate can overlap the drain and source regions by a specified amount. By applying a sufficiently high voltage to the control gate, a vertical channel is formed in the body as a conductive path in the body. The transistor may therefore provide a switchable conductive path between conductive lines above and below the transistor. That is, the transistor can be in a conductive state in which one or more paths is provided or a non-conductive state when a path is not provided.

For example, in the VBL memory device, a set of transistors can be provided in parallel rows below a three-dimensional memory structure. The three-dimensional memory structure comprises a stack of alternating conductive layers (e.g., control gate layers or word line layers) and dielectric layers. Trenches are formed in the stack and a resistance change memory film is deposited to coat sidewalls of the trenches. A conductor (a VBL material) then fills the trenches. An etching operation then removes portions of the memory film and VBL material, forming individual, spaced apart vertical bit lines, each of which is connected to a respective transistor.

Memory cells are formed by regions of the resistance change memory film adjacent to the conductive layers. In this arrangement, each transistor can provide a conductive path between a horizontal bit line below the transistor and a VBL above the transistor, to provide a desired programming voltage in the VBL. A desired voltage is also provided to one or more of the conductive layers corresponding to the memory cell to be programmed.

One approach is to provide a control gate on opposite sides of each transistor body. This approach can provide two channels in a transistor body so that a higher current can be passed, compared to the use of one such control gate. However, for scalability, it is desirable for the transistors to be as compact as possible. Another approach is to share a single control gate between two adjacent transistor bodies. However, with this approach, it is difficult to supply a full programming voltage to the VBL connected to one of the transistors without inadvertently supplying some voltage to the VBL connected to the other transistor, thereby potentially inadvertently programming the associated memory cells. A solution provided herein involves the use of both shared and non-shared control gates for a set of transistors.

Various implementations of a semiconductor device with such a set of transistors is provided. One approach misaligns the transistor bodies with the VBLs when the width of the shared control gate is less than a spacing between VBLs in the stack. Another approach aligns the transistor bodies with the VBLs. In another aspect, the shared control gate can be fabricated so that it fills a gap between transistor bodies and has a common height with the non-shared control gates, thus maximizing the volume of the shared control gate and minimizing its resistance. In another aspect, the transistors are controlled to program memory cells associated with one VBL while avoiding programming of memory cells associated with an adjacent VBL. In another aspect, only one control gate of a transistor is initially used to attempt to program one or more memory cells of the associated VBL and subsequently both control gates are used to attempt to program the one or more memory cells. Various aspects of the above and other features are discussed below.

FIG. 1 is a schematic block diagram of a re-programmable non-volatile memory system 100 connected to a host system 150. Data input-output circuits 101 are connected to provide and receive analog electrical signals in parallel over global bit lines (GBLs) 102, also referred to as metal lines herein. The signals represent data stored in addressed memory elements in a memory cell array 103. The data input-output circuits may include sense amplifiers for converting these electrical signals into digital data values during reading. The digital values are then sent over data input-output lines 104 to a controller 105. Conversely, data to be programmed into the memory array is sent by the controller to the data input-output circuits, which program the data into the addressed memory elements by placing appropriate voltages on the global bit lines. For binary operation, one voltage level is typically placed on a global bit line to represent a binary "1" and another voltage level to represent a binary "0". The memory elements are addressed for reading or programming by voltages placed on the word lines (WLLs) 106 and row select lines 107 by respective word line select circuits 108 and local bit line select circuits 109. In an example three-dimensional memory structure, the memory elements between a selected word line and any of the local bit lines connected through the selection transistors to the global bit lines may be addressed for programming or reading by appropriate voltages being applied through the select circuits 108 and 109.

The selection transistors may be provided as vertical channel transistors as described further below in detail.

The controller 105 receives data from and sends data to the host system 150. The controller can include a random access memory (RAM) 113 for temporarily storing this data and associated information. Commands, status signals and addresses of data being read or programmed are also exchanged between the controller and the host. The memory system can operate with various host systems such as personal computers (PCs), laptops and other portable computers, cellular telephones, personal digital assistants (PDAs), digital still cameras, digital movie cameras and portable audio players. The host typically connects to the memory system using a built-in receptacle (for receiving a memory card or flash drive that comprises the memory system) or by a wired or wireless path. Alternatively, the memory system may be built into the host system.

The controller conveys commands received from the host to decoder/driver circuits 110 via lines 111. Similarly, status signals are communicated to the controller the from decoder/driver circuits. The decoder/driver circuits 110 can be simple logic circuits, where the controller controls nearly all of the memory operations, or the circuits can include a state machine to control at least some of the repetitive memory operations necessary to carry out given commands. Control signals resulting from decoding commands are applied from the decoder/driver circuits to the word line select circuits 108, local bit line select circuits 109 and data input-output circuits 101. Also connected to the decoder/driver circuits are address lines 112 from the controller that carry physical addresses of memory elements to be accessed within the array 103 in order to carry out a command from the host. The physical addresses correspond to logical addresses received from the host system, where the conversion is made by the controller and/or the decoder/driver circuits. As a result, the local bit line select circuits partially address the designated storage elements within the array by placing appropriate voltages on the control gates of the selection transistors to connect selected local bit lines with the global bit lines. The addressing is completed by the decoder/driver circuits applying appropriate voltages to the word lines of the array.

The memory system of FIG. 1 can be implemented as a three-dimensional memory structure such as depicted further below, in example embodiments. Although each of the memory elements in the memory array may be individually addressed to be programmed or read, it is also possible to program or read sets of memory cells in parallel. For example, one row of memory elements on one plane may be programmed and read in parallel. The number of memory elements programmed or read in parallel depends on the number of memory elements connected to the selected word line. In some arrays, the word lines may be segmented so that only a portion of the total number of memory elements connected along their length may be addressed for parallel operation, namely the memory elements connected to a selected one of the segments. In some arrays, the number of memory elements programmed in one operation may be less than the total number of memory elements connected to the selected word line.

Previously programmed memory elements whose data have become obsolete may be addressed and re-programmed from the states in which they were previously programmed. The starting states can differ among the memory elements being re-programmed in parallel. In some cases, a group of memory elements is reset to a common state before they are re-programmed. For example, the memory elements may be grouped into blocks, where the memory elements of each block are simultaneously reset to a common state, e.g., an erased state, in preparation for subsequently programming them.

The individual blocks of memory elements may be further divided into a plurality of pages of storage elements, wherein the memory elements of a page are programmed or read together.

A current sensor 114 may be provided to detect a level of current through a memory cell based on a level of current through a conductive portion of a word line layer. The current can be compared to a threshold current using a comparison circuit, where a programming operation is modified based on the current in a memory cell. For example, as described further below in connection with FIGS. 7C and 8, a cell may be considered to have passed a verify test based on the level of current relative to a threshold level. Or, a cell may transition from a mode in which one control gate is at a high level and one control gate is at a low level for an associated transistor body, to a mode in which both control gates are at a high level.

The memory cell array is an example of a memory structure. A memory structure may comprise one or more array of memory cells including a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2A depicts a three-dimensional memory structure 200 as an example of the memory cell array 103 of FIG. 1. The array includes stacked and alternating layers of an insulating material (insulation layers INL0, INL1, INL2 and INL3) and a conductive material (word line layers WLL0, WLL1, WLL2 and WLL3). For example, INL0 includes insulation portions IN0a, IN0b and IN0c. WLL0 includes word line portions WL0a, WL0b and WL0c. INL1 includes insulation portions IN1a, Nib and IN1c. WLL1 includes word line portions WL1a, WL1b and WL1c. INL2 includes insulation portions IN2a, IN2b and IN2c. WLL2 includes word line portions WL2a, WL2b and WL2c. INL3 includes insulation portions IN3a, IN3b and IN3c. WLL3 includes word line portions WL3a, WL3b and WL3c. Memory films are provided between the stacked layers and the vertical bit lines. The memory films include MF0a and MF0b on either side of a vertical bit line VBL0a, MF0c and MF0d on either side of VBL0b, MF0e and MF0f on either side of VBL0c, MF1a and MF1b on either side of VBL1a, MF1c and MF1d on either side of VBL1b, and MF1e and MF1f on either side of VBL1c.

A Cartesian coordinate system indicates a vertical direction (z) and lateral directions x and y. In one approach, for a given word line layer, every other word line portion in the x direction is connected to one another. For example, for WLL3, a path 210 indicates that WL3a and WL3c are connected via a common conductive path. For WLL2, WL2a and WL2c are connected via a common conductive path. For WLL1, WL1a and WL1c are connected via a common conductive path. For WLL0, WL0a and WL0c are connected via a common conductive path. This is consistent with the use of a comb pattern as discussed in connection with FIG. 3.

Each vertical bit line can be selectively connected at its bottom to a global bit line via a selection transistor. For example, VBL0a, VBL0b and VBL0c can be connected to GBL0 via a selection transistors ST0a, ST0b and ST0c, respectively, which are controlled by select gates SG0a, SG0b and SG0c, respectively. Further, VBL0c can be connected to GBL1 via a selection transistor ST1c (which has the select gate SG0c). The selection transistors for VBL1a and VBL1b are not depicted.

Memory cells are formed by regions in which the word lines layers and vertical bit lines intersect.

The memory film can be of various types. Example memory films include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). The material may be formed in an initial state, for example, a relatively low-resistance state. Upon application of sufficient voltage, the material switches to a stable high-resistance state which is maintained after the voltage is removed. In some cases, the resistance switching is reversible such that subsequent application of an appropriate current or voltage can serve to return the material to a stable low-resistance state which is maintained after the voltage or current is removed. This conversion can be repeated many times. For some materials, the initial state is high-resistance rather than low-resistance. A set process may refer to switching the material from high to low resistance, while a reset process may refer to switching the material from low to high resistance. The set and reset processes can be considered to be programming processes which change the resistance state. In other cases, the resistance switching is irreversible.

The global bit lines may extend in a silicon substrate parallel to one another and directly under the selection transistors and vertical bit lines.

Each selection transistor may be a pillar shaped Thin Film Transistor (TFT) FET or JFET, for instance.

FIG. 2B depicts a stack 220 of alternating conductive layers and dielectric layers used to form the three-dimensional memory structure 200 of FIG. 2A.

FIG. 2C depicts a structure 240 which is obtained by etching trenches in the y-direction in the stack 220 of FIG. 2A, and filling the trenches with memory films MF1a1, MF1b1, MF1c1, MF1d1, MF1e1 and MF1f1, and vertical bit line material VBL1a1, VBL1b1 and VBL1c1. An example trench 241 which is filled is depicted.

FIG. 2D depicts a structure 260 which is obtained by etching away portions of the memory films and vertical bit line material to form voids and depositing an insulating filler F1-F6 in the voids. The insulating filler is omitted from FIG. 2A for clarity.

Figure 3:
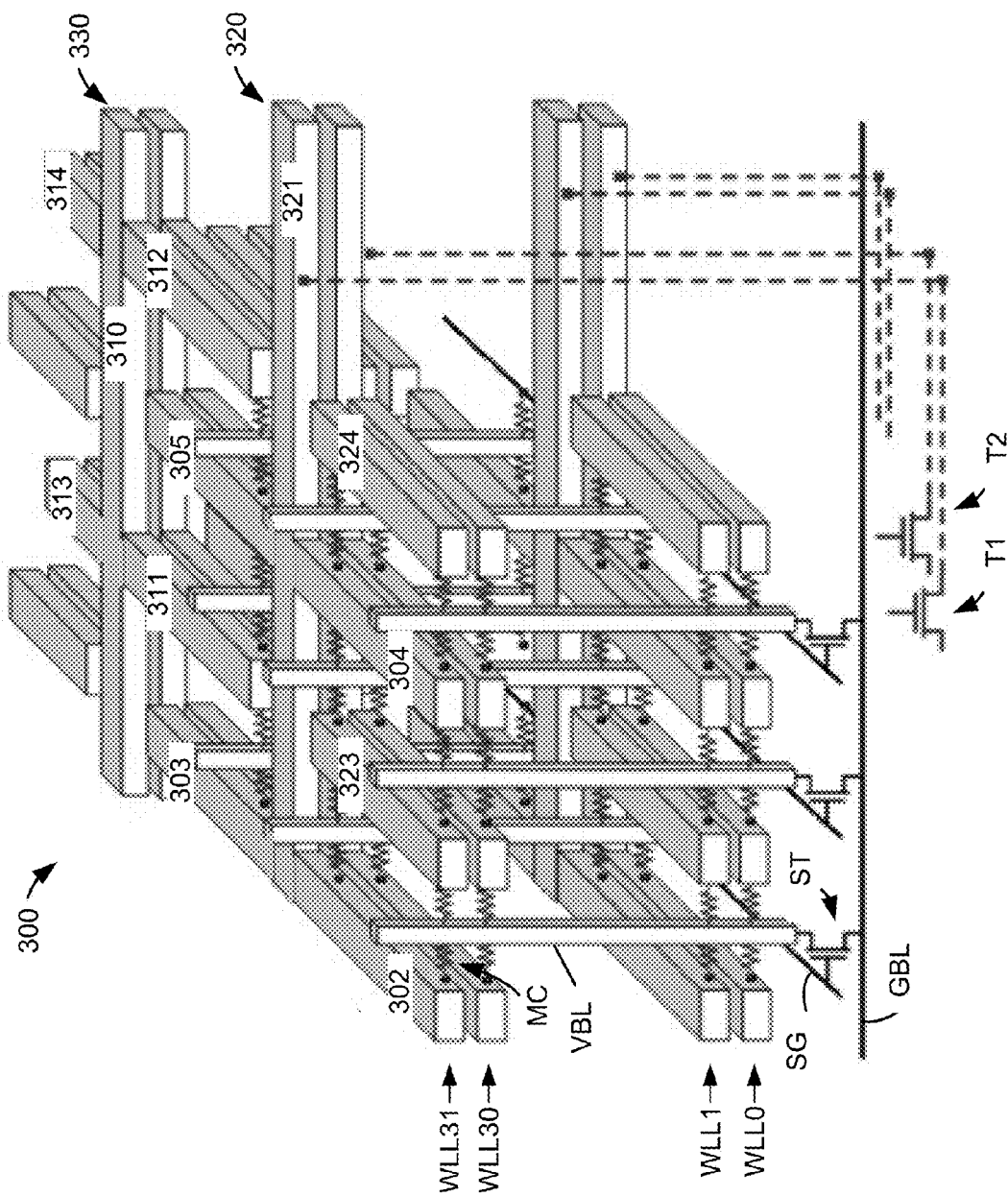
FIG. 3 depicts a three-dimensional memory structure 300 as another example of the memory cell array 103 of FIG. 1, where comb shaped word line portions are used.

FIG. 3 depicts a three-dimensional memory structure 300 as another example of the memory cell array 103 of FIG. 1, where comb shaped word line portions are used. In this example, there are 32 word line layers, WLL0 to WLL31. Further, each word line layer includes multiple combs. For example, at WLL31, a comb 320 includes a central portion 321, lateral portions 302 and 304 (or fingers) on one side, and lateral portions 303 and 305 on the other side. A comb 330 includes a central portion 310, lateral portions 311 and 312 on one side, and lateral portions 313 and 314 on the other side. Lateral portions 323 and 324 extend from a central portion 341 of another comb 340 (see FIG. 3) which is not shown in full. Memory cells (MC) are represented as resistors which extend between a vertical bit line (VBL) and a word line portion. An example selection transistor (ST), select gate (SG) and global bit line (GBL) are also depicted. Additional example transistors T1 and T2 are provided between a voltage source and the word line portions. These transistors are used to provide a bias on a comb. As mentioned, selection transistors are used to provide a bias on one or more VBLs. The difference between the bias on the comb and the bias on the VBL is a programming or read voltage.

The word line portions therefore extend like fingers of a comb. Further, the fingers of different combs are interdigitated. As a result, during a programming operation, a voltage can be applied to one comb but not to another, if desired. Other configurations are possible as well which do not include a comb layout. A comb is a conductive path connected to a set of cells.

Figure 4A:
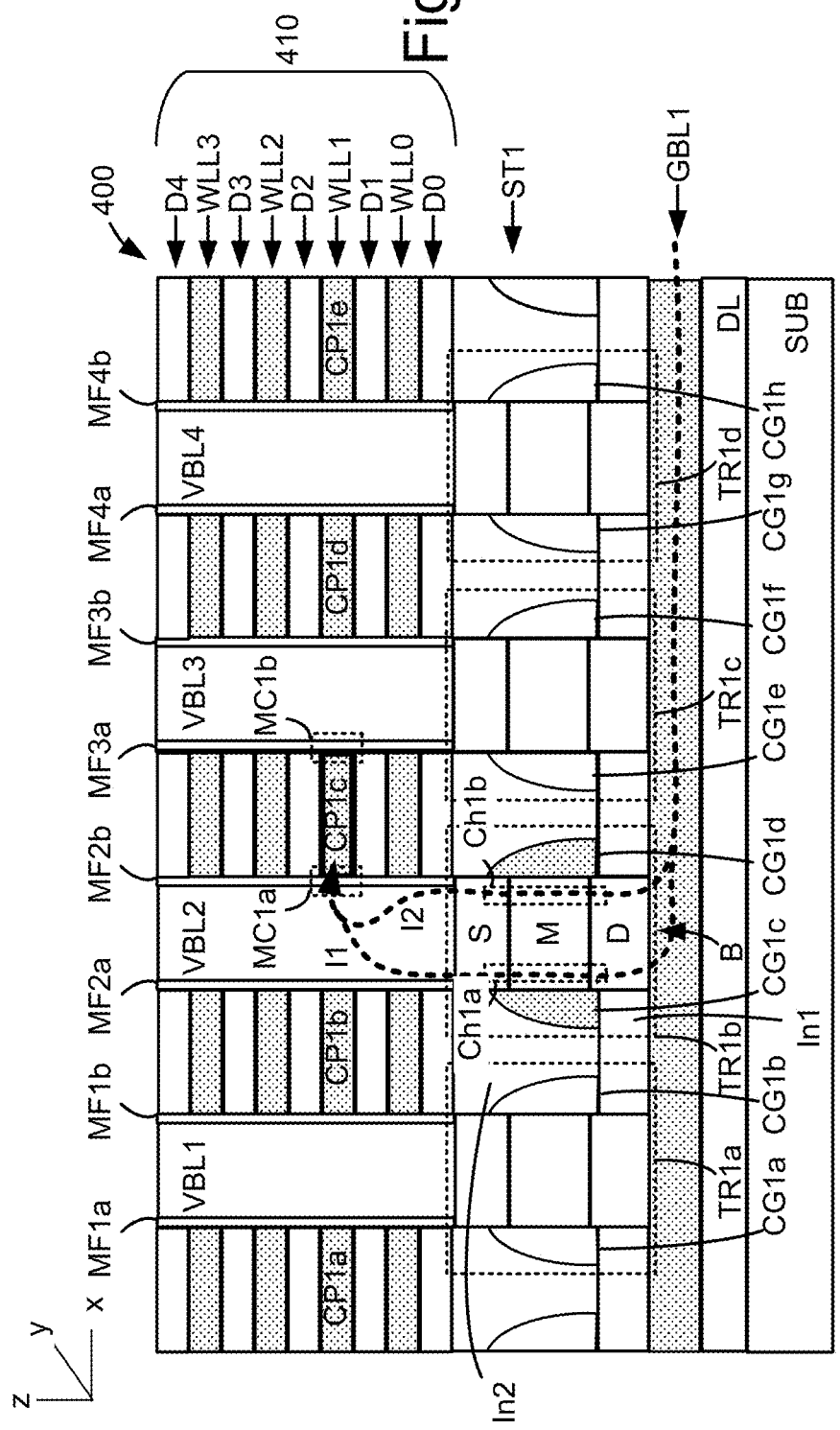
FIG. 4A depicts an example implementation of a set of selection transistors, such as for use in the memory devices of FIGS. 2A and 3, where each selection transistor has non-shared control gates.

FIG. 4A depicts an example implementation of a set of selection transistors, such as for use in the memory devices of FIGS. 2A and 3, where each selection transistor has non-shared control gates. A memory device 400 comprises a stack 410 above a set of transistors ST1. The transistors are formed above a global bit line GBL1, which in turn is on a dielectric layer (DL) on a substrate (SUB). The stack comprises alternating word line layers (WLL0-WLL4) and dielectric layers (D0-D4). Each word line layer comprises conductive portions. For example, WLL1 comprises conductive portions CP1a, CP1b, CP1c, CP1d and CP1e. Further, memory films MF1a and MF1b are associated with vertical bit line VBL1, memory films MF2a and MF2b are associated with vertical bit line VBL2, memory films MF3a and MF3b are associated with vertical bit line VBL3, and memory films MF4a and MF4b are associated with vertical bit line VBL4. A memory cell is located at the intersection of each conductive portion and a portion of a memory film. For example, a memory cell MC1a is located in a portion of MF2b which is adjacent to CP1c, and a memory cell MC1b is located in a portion of MF3a which is adjacent to CP1c.

The set of transistors comprises transistors TR1a, TR1b, TR1c and TR1d. Each transistor comprises a transistor body (such as example body B in TR1b comprising a source region S, a middle region M and a drain region D) and two control gates, one on each opposing side of the transistor body. For example, TR1a has control gates CG1a and CG1b, TR1b has control gates CG1c and CG1d, TR1c has control gates CG1e and CG1f, and TR1d has control gates CG1g and CG1h. Insulation In1 (e.g., oxide) is provided below the control gates and insulation In2 is provided between control gates of different transistors.

When a sufficiently high voltage is applied to a control gate, a channel is formed in an area of the body which is adjacent to the control gate. The sufficiently high voltage may be a gate voltage Vg such that Vg−Vs>Vth, where Vs is the source voltage of the transistor (equal to the voltage in the associated VBL) and Vth is the threshold voltage of the transistor. When a low voltage is applied to a control gate, a channel is not formed in an area of the body which is adjacent to the control gate. The low voltage may be a gate voltage Vg such that Vg−Vs<Vth. In FIG. 4A-5B, the shaded control gates have the high voltage applied and the non-shaded control gates have the low voltage applied. For example, when a sufficiently high voltage is applied to CG1c, a channel Ch1a is formed in the body B. This channel allows a current I1 to flow from GBL1 to VBL2, through MC1a and to CP1c for programming MC1a. At the same time, when a sufficiently high voltage is applied to CG1d, a channel Ch1b is formed in the body B. This channel allows a current I2 to flow from GBL1 to VBL2, through MC1a and to CP for programming MC1a. The sum of these currents is the total programming current for MC1*a*. These currents are provided due to a voltage difference between GBL1 and CP1*c*.

Thus, during a programming (set or reset) process, biases are applied to one or more conductive portions of word line layers (such as via one or more selected combs) via associated circuitry, and to one or more selected VBLs via associated selection transistors. The programming voltage is the difference between these biases. In one option, a bias of the remaining, unselected VBLs and the unselected conductive portions of the word line layers is allowed to float or is set at a level which prevents programming, during the set and reset processes.

Moreover, a programming operation can store a unit of data using all of the cells which are connected to one conductive path such as a comb. However, it is also possible for a programming operation to store a unit of data using fewer than all of the cells which are connected to one conductive path, or using cells which are connected to multiple conductive paths.

Since the control gates of TR1*b* are not shared with other transistors bodies along GBL1, one or more memory cells along VBL2 can be programmed without programming memory cells along other VBLs. However, additional space is consumed by the use of separate control gates.

Logic circuits (not shown) can be provided in the dielectric layer DL.

FIG. 4B depicts another example implementation of a set of selection transistors, where each selection transistor has shared control gates. In the memory device 450, the stack 410 is the same as in FIG. 4A. However, in the set of transistors ST2, each transistor shares a control gate with a neighbor transistor along GBL1. The set of transistors includes transistors TR2*a*, TR2*b*, TR2*c* and TR2*d*. A control gate CG2*a* is shared by TR2*a* and another transistor body to the left (not shown). A control gate CG2*b* is shared by TR2*a* and TR2*b*. A control gate CG2*c* is shared by TR2*b* and TR2*c*. A control gate CG2*d* is shared by TR2*c* and TR2*d*. A control gate CG2*e* is shared by TR2*d* and another transistor body to the right (not shown).

During programming, when a sufficiently high voltage is applied to CG2*b*, a channel Ch2*a* is formed in the body B1 of TR2*a*. Assuming that none of the conductive portions connected to VBL1 is biased for programming, there is not a sufficient amount of current flowing from GBL1 to VBL1 to program the memory cells along VBL1. However, a channel Ch2*b* is also formed in the body B2 of TR2*b*. Since a programming bias is provided to CP2*c* in this example, the channel Ch2*b* allows a current I1 to flow from GBL1 to VBL2, through MC1*a* and to CP2*c* for programming MC1*a*. At the same time, when a sufficiently high voltage is applied to CG2*c*, a channel Ch2*c* is formed in the body B2 of TR2*b*. This channel allows a current I2 to flow from GBL1 to VBL2, through MC1*a* and to CP2*c* for programming MC1*a*. The sum of these currents is the total programming current for MC1*a*.

At the same time, the voltage applied to CG2*c* causes a channel Ch2*d* to be formed in the body B3 of TR2*c*. Since the conductive portion CP2*c* is biased for programming, a current I3 flows from GBL1 to VBL3, through MC1*b* and to CP2*c* for potentially programming MC1*b*, a memory cell along VBL3. However, the current I3 is less than I1+I2, so MC1*b* may or may not be programmed. The current which is introduced to MC1*b* in this example is an inadvertent side effect of the programming of MC1*a*.

In this example, the width of the stack is the same as in FIG. 4A, although in practice, the shared control gates can be narrower as depicted in the following examples.

Figure 5A:
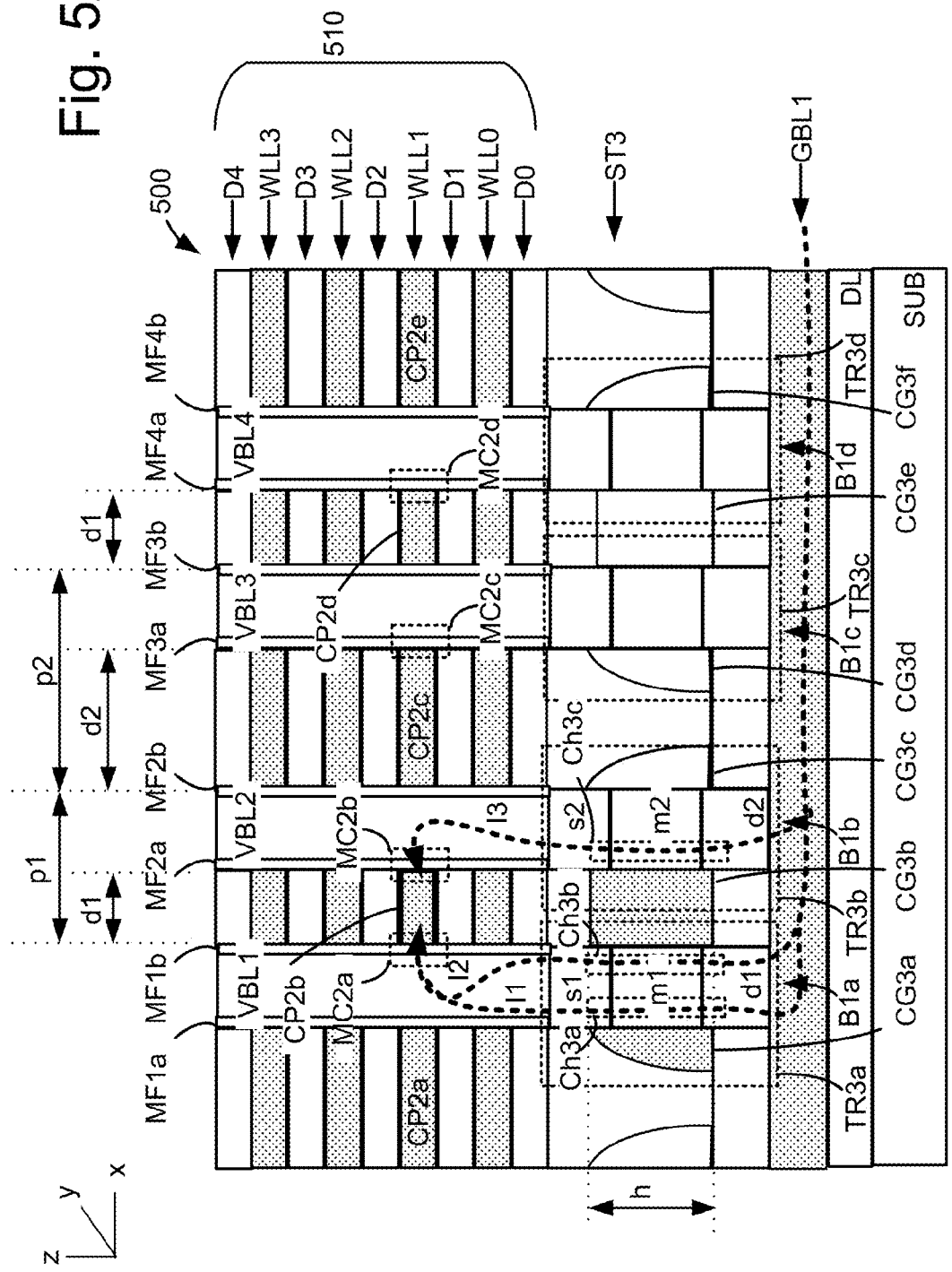
FIG. 5A depicts another example implementation of a set of selection transistors, where each selection transistor has a shared control gate and a non-shared control gate.

FIG. 5A depicts another example implementation of a set of selection transistors, where each selection transistor has a shared control gate and a non-shared control gate. In the memory device 500, the stack 510 is narrower in the x-direction than in FIGS. 4A and 4B because of the configuration of the shared control gates. In the set of transistors ST3, the control gates are alternatingly shared and non-shared along GBL1. The set of transistors includes transistors TR3*a*, TR3*b*, TR3*c* and TR3*d* which provide switchable conductive paths to VBL1, VBL2, VBL3 and VBL4, respectively. Example memory cells MC2*a*, MC2*b*, MC2*c* and MC2*d* are arranged along VBL1, VBL2, VBL3 and VBL4, respectively.

A non-shared control gate CG3*a* is adjacent to the body B1*a* of TR3*a*. A shared control gate CG3*b* is adjacent to the body B1*a* of TR3*a* and the body B1*b* of TR3*b*. A non-shared control gate CG3*c* is adjacent to the body B1*b* of TR3*b*.

A non-shared control gate CG3*d* is adjacent to the body B1*c* of TR3*c*. A shared control gate CG3*e* is adjacent to the body B1*c* of TR3*c* and the body B1*d* of TR3*d*. A non-shared control gate CG3*f* is adjacent to the body B1*d* of TR3*d*.

During programming, when a sufficiently high voltage is applied to CG3*a*, a channel Ch3*a* is formed in the body B1*a* of TR3*a*. A current I1 flows through this channel, from GBL1 to VBL1 and CP2*b*. Also, when a sufficiently high voltage is applied to CG3*b*, a channel Ch3*b* is formed in the body B1*a* of TR3*a*. A current I2 flows through this channel, from GBL1 to VBL1 and CP2*b*. A total current of I1+I2 flows through MC2*a*.

Due to the high voltage on CG3*b*, a channel Ch3*c* is also formed in the body B1*b* of TR3*b*. Since a programming bias is provided to CP2*b* in this example, the channel Ch3*c* allows a current I3 to flow from GBL1 to VBL2, through MC2*b* and to CP2*b* for programming MC2*b*. a memory cell along VBL2. However, the current I3 is less than I1+I2 so MC2*b* may or may not be programmed. The current which is introduced to MC2*b* in this example is an inadvertent side effect of the programming of MC2*a*.

The value d1 is a distance between first and second vertical channel transistor bodies (B1*a* and B1*b*, respectively) which have a common shared control gate (CG3*b*). This distance is also the width of the shared control gate. The value d2 is a distance between second and third vertical channel transistor bodies (B1*b* and B1*c*, respectively). The value h is a height of the control gates. The shared and non-share control gates may have the same height, in one approach. The value p1 is a pitch between the first and second vertical channel transistor bodies. p2 is a pitch between the second and third vertical channel transistor bodies. Also, p2>p1.

Accordingly, it can be seen that, in one embodiment, a semiconductor device (500) comprises: a substrate (SUB); a first horizontal bit line (GBL1) on the substrate; and a three-dimensional memory structure (510) above the first horizontal bit line. The three-dimensional memory structure comprises first (VBL1) and second (VBL2) vertical bit lines, memory cells (MC2*a*) arranged along the first vertical bit line and memory cells (MC2*b*) arranged along the second vertical bit line. The semiconductor device further includes a first selection transistor (TR3*a*) arranged between the first horizontal bit line and the first vertical bit line, where the first selection transistor comprises a first vertical channel transistor body (B1*a*), a first control gate (CG3*a*) and a second control gate (CG3*b*), and the first control gate is not shared with any other vertical channel transistor body which is arranged along the first horizontal bit line. The semiconductor device further includes a second selection transistor (TR3*b*) arranged between the first horizontal bit line and the second vertical bit line, where the second selection transistor comprises a second vertical channel transistor body (B1b), the second control gate (CG3b) as a shared control gate which is shared with the first selection transistor, and a third control gate (CG3c), where the third control gate is not shared with any other vertical channel transistor body which is arranged along the first horizontal bit line.

The memory cells (MC2a) arranged along the first vertical bit line may be in a first NAND string; and the memory cells (MC2b) arranged along the second vertical bit line may be in a second NAND string. The memory cells arranged along the first vertical bit line and the memory cells arranged along the second vertical bit line may comprise resistance change memory cells.

In another aspect, the first selection transistor (TR3a) comprises a switchable conductive path (Ch3a, Ch3b) between the first horizontal bit line and the first vertical bit line; and the second selection transistor (TR3b) comprises a switchable conductive path (Ch3c) between the first horizontal bit line and the second vertical bit line.

In another aspect, the second control gate has a uniform height (h) between the first and second vertical channel transistor bodies.

The height of the second control gate can also be uniform with heights of the first and third control gates.

In another aspect, the first vertical channel transistor body comprises a pillar which is over the first horizontal bit line and under the first vertical bit line; and the second vertical channel transistor body comprises a pillar which is over the first horizontal bit line and under the second vertical bit line.

In another aspect, the first vertical channel transistor body comprises a middle region (m1) between source (s1) and drain (d1) regions; the second vertical channel transistor body comprises a middle region (m2) between source (s2) and drain (d2) regions; the first control gate (CG3a) extends between the source and drain regions of the first vertical channel transistor body; the second control gate (CG3b) extends between the source and drain regions of the first vertical channel transistor body and between the source and drain regions of the second vertical channel transistor body; and the third control gate (CG3c) extends between the source and drain regions of the second vertical channel transistor body.

In another aspect, the first and second control gates are on opposite sides of the first vertical channel transistor body (B1a); and the second and third control gates are on opposite sides of the second vertical channel transistor body (Bib).

Figure 5B:
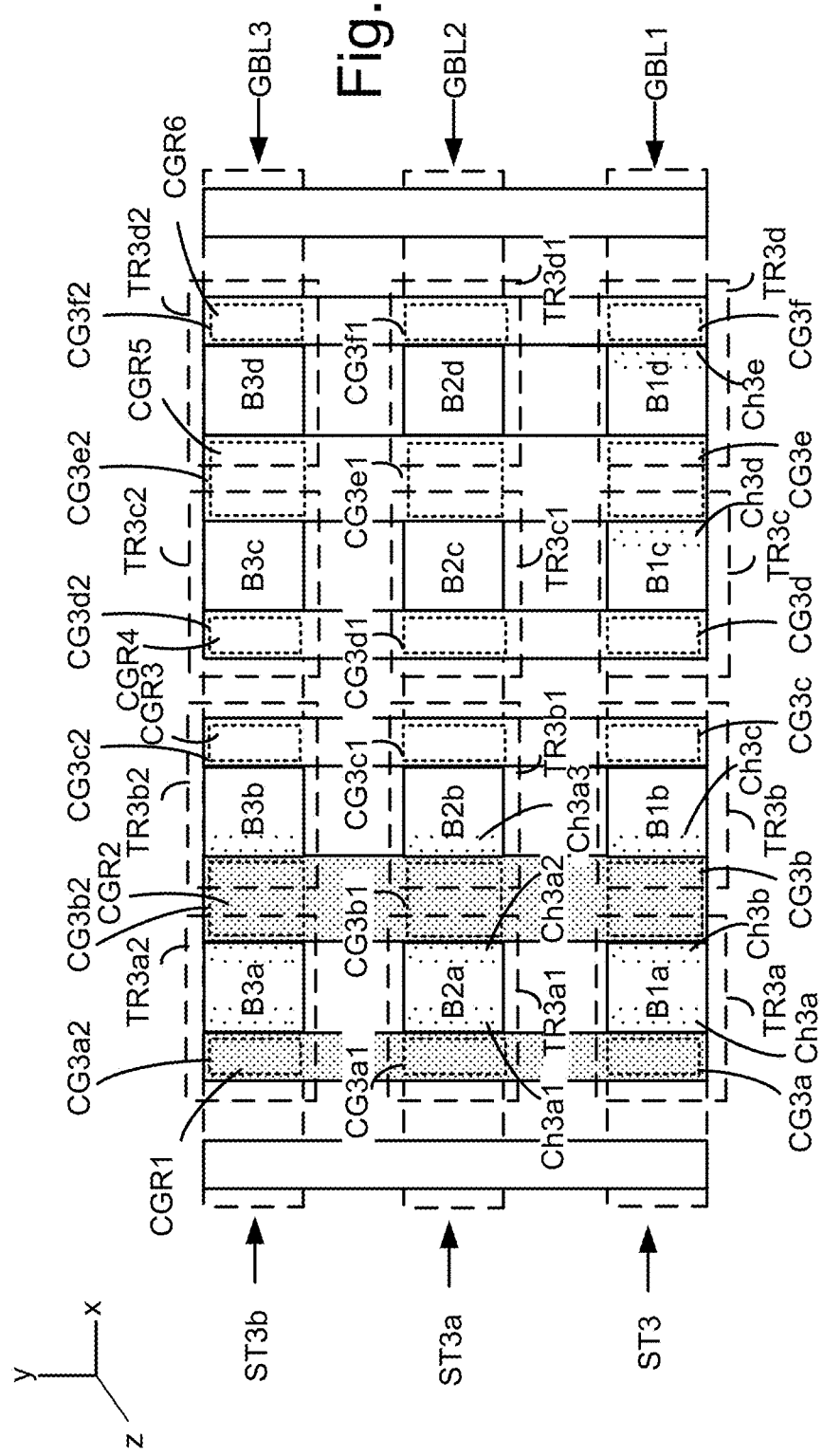
FIG. 5B depicts a top view of a set of selection transistors consistent with FIG. 5A.

FIG. 5B depicts a top view of a set of selection transistors consistent with FIG. 5A. This example shows a 4×3 grid of transistors in the x-y plane. Six lines or rails of conductive material (e.g., CGR1, CGR2, CGR3, CGR4, CGR5 and CGR6) may extend in the y direction on both sides of the transistor bodies. The control gates are formed by portions of the conductive material which are adjacent to the transistor bodies. For example, control gates CG3a, CG3a1 and CG3a2 are formed by portions of CGR1.

The transistors TR3a-TR3d and control gates CG3a-CG3f are depicted along GBL1 in the set of transistors ST3. The transistors TR3a, TR3b, TR3c and TR3d provide switchable conductive paths to VBL1, VBL2, VBL3 and VBL4, respectively (see also FIG. 5C).

Transistors TR3a1, TR3b1, TR3c1 and TR3d1 having bodies B2a, B2b, B2c and B2d, respectively, and control gates CG3a1, CG3b1, CG3c1, CG3d1, CG3e1 and CG3f1 are depicted along GBL2 in a set of transistors ST3a. The transistors TR3a1, TR3b1, TR3c1 and TR3d1 provide switchable conductive paths to VBL1a, VBL2a, VBL3a and VBL4a, respectively (see also FIG. 5C).

Transistors TR3a2, TR3b2, TR3c2 and TR3d2 having bodies B3a, B3b, B3c and B3d, respectively, and control gates CG3a2, CG3b2, CG3c2, CG3d2, CG3e2 and CG3f2 are depicted along GBL3 in a set of transistors ST3b. The transistors TR3a2, TR3b2, TR3c2 and TR3d2 provide switchable conductive paths to VBL1b, VBL2b, VBL3b and VBL4b, respectively (see also FIG. 5C).

Channels Ch3a in B1a and Ch3a1 in B2a, are formed due to a high voltage on CGR1. Channels Ch3b in B1a, Ch3c in B1b, Ch3a2 in B2a, and Ch3a3 in B2b, are formed due to a high voltage on CGR2. Example channels Ch3d in B1c and Ch3e in B1d are also depicted.

In this example, the first vertical channel transistor body is aligned with the first vertical bit line; and the second vertical channel transistor body is aligned with the second vertical bit line.

FIG. 5C depicts a top view of a set of vertical bit lines and selection transistors consistent with FIGS. 5A and 5B. The selection transistors TR3a, TR3b, TR3c and TR3d provide a switchable path between VBL1, VBL2, VBL3 and VBL4, respectively, and GBL1. The selection transistors TR3a1, TR3b1, TR3c1 and TR3d1 provide a switchable path between VBL1a, VBL2a, VBL3a and VBL4a, respectively, and GBL2. The selection transistors TR3a2, TR3b2, TR3c2 and TR3d2 provide a switchable path between VBL1b, VBL2b, VBL3b and VBL4b, respectively, and GBL3. Example memory cells MC2a, MC2b, MC2c and MC2d are arranged along VBL1, VBL2, VBL3 and VBL4, respectively.

Another set of transistors includes transistors TR3a1, TR3b1, TR3c1 and TR3d1 which provide switchable conductive paths between VBL1a, VBL2a, VBL3a and VBL4a, respectively, and GBL2. Example memory cells MC2a1, MC2b1, MC2c1 and MC2d1 are arranged along VBL1a, VBL2a, VBL3a and VBL4a, respectively.

Another set of transistors includes transistors TR3a2, TR3b2, TR3c2 and TR3d2 which provide switchable conductive paths between VBL1b, VBL2b, VBL3b and VBL4b, respectively, and GBL3. Example memory cells MC2a2, MC2b2, MC2c2 and MC2d2 are arranged along VBL1b, VBL2b, VBL3b and VBL4b, respectively.

Also referring to FIGS. 5A and 5B, this example provides, in the three-dimensional memory structure (510), third (VBL1a) and fourth (VBL2a) vertical bit lines, memory cells (MC2a1) arranged along the third vertical bit line and memory cells (MC2b1) arranged along the fourth vertical bit line; a second horizontal bit line (GBL2) spaced apart from the first horizontal bit line (GBL1); a third selection transistor (TR3a 1) arranged between the second horizontal bit line and the third vertical bit line, the third selection transistor comprises a switchable conductive path (Ch3a1, Ch3a2) between the second horizontal bit line and the third vertical bit line, the third selection transistor comprises a third vertical channel transistor body (B2a), a fourth control gate (CG3a1) and a fifth control gate (CG3b1), the fourth control gate is not shared with any other vertical channel transistor body which is arranged along the second horizontal bit line, the first (CG3a) and fourth (GC3a1) control gates are electrically connected (by conductive rail CGR1) and the second (CG3b) and fifth (CG3b1) control gates are electrically connected (by conductive rail CGR2). Further, a fourth selection transistor (TR3b1) is arranged between the second horizontal bit line (GBL2) and the fourth vertical bit line (VLB2a), where the fourth selection transistor comprises a switchable conductive path (Ch3a3) between the second horizontal bit line and the fourth vertical bit line, the fourth selection transistor comprises a fourth vertical channel transistor body (B2b), the fifth control gate as a shared control gate which is shared with the third selection transistor, and a sixth control gate (CG3c1), where the sixth control gate is not shared with any other vertical channel transistor body which is arranged along the second horizontal bit line, and the third and sixth control gates are electrically connected (by conductive rail CGR3).

In another aspect, the three-dimensional memory structure includes third (VBL3) and fourth (VBL4) vertical bit lines, memory cells (MC2c) arranged along the third vertical bit line and memory cells (MC2d) arranged along the fourth vertical bit line; a third selection transistor (TR3c) arranged between the first horizontal bit line and the third vertical bit line, where the third selection transistor comprises a switchable conductive path (Ch3d) between the first horizontal bit line and the third vertical bit line, the third selection transistor comprises a third vertical channel transistor body (B1c), a fourth control gate (CG3d) and a fifth control gate (CG3e), and the fourth control gate is not shared with any other vertical channel transistor body which is arranged along the first horizontal bit line. A fourth selection transistor (TR3d) is arranged between the first horizontal bit line and the fourth vertical bit line, the fourth selection transistor comprises a switchable conductive path (Ch3e) between the first horizontal bit line and the fourth vertical bit line, the fourth selection transistor comprises a fourth vertical channel transistor body (B1d), the fifth control gate as a shared control gate which is shared with the third selection transistor, and a sixth control gate (CG3f), where the sixth control gate is not shared with any other vertical channel transistor body which is arranged along the first horizontal bit line.

In another aspect, a distance (d1) between the first and second vertical channel transistor bodies is less than a distance (d2) between the second and third vertical channel transistor bodies (see FIG. 5A).

In another aspect, a distance (d1) between the first and second vertical channel transistor bodies is equal to a distance (d1) between the third and fourth vertical channel transistor bodies.

In another aspect, the three-dimensional memory structure comprises alternating conductive layers (WLL0-WLL3) and dielectric layers (D0-D4) arranged along the first and second vertical bit lines.

In another aspect, first (MF1b) and second (MF2a) memory films are arranged along the first and second vertical bit lines, respectively; the memory cells (MC2a) arranged along the first vertical bit line are formed by portions of the first memory film which intersect with the conductive layers; and the memory cells (MC2b) arranged along the second vertical bit line are formed by portions of the second memory film which intersect with the conductive layers.

Figure 6A:
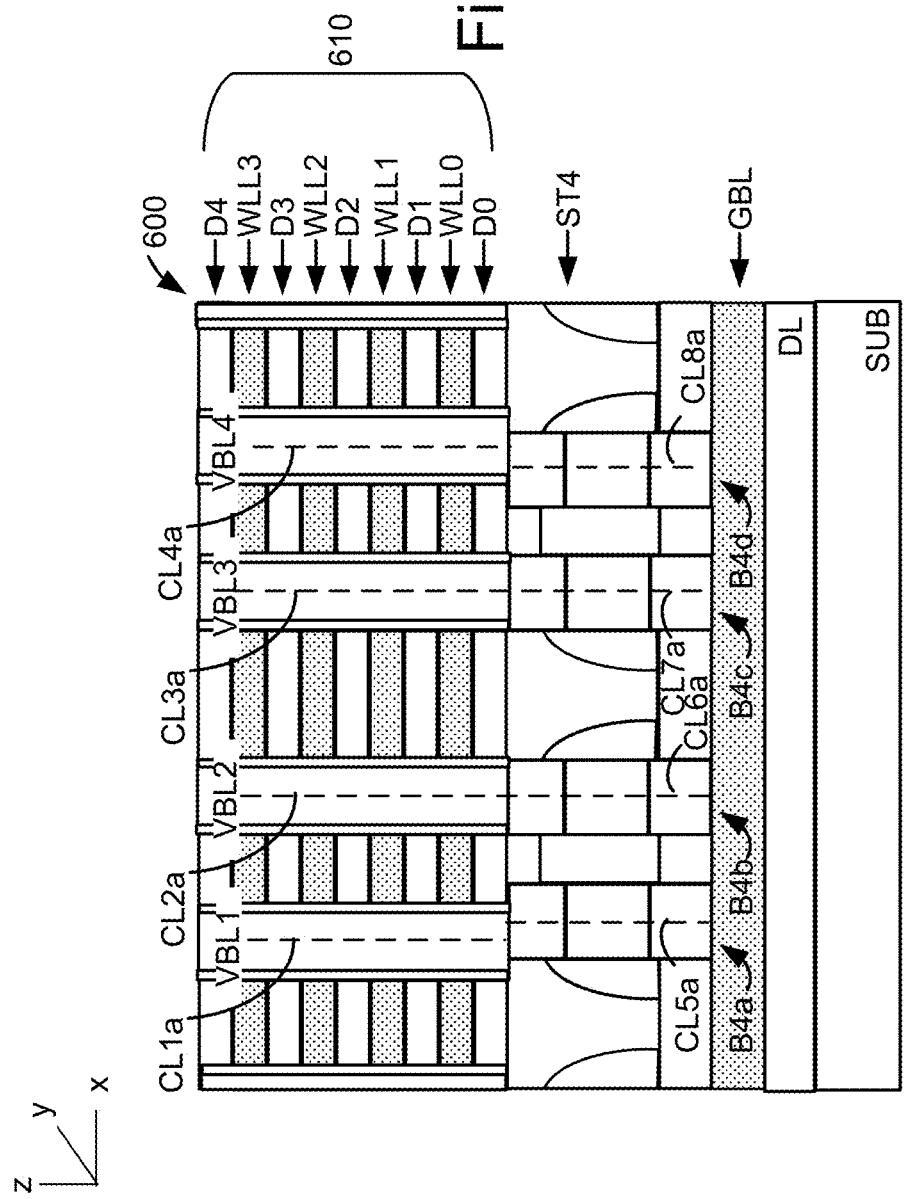
FIG. 6A depicts a memory device in which selection transistors are alternately aligned or misaligned with vertical bit lines.

FIG. 6A depicts a memory device in which selection transistors are alternately aligned or misaligned with vertical bit lines. A memory device 600 includes a stack 610 above a set of selection transistors ST4. In some cases, it may be desired to misalign some of the transistor bodies with their associated vertical bit lines, such as to provide a more compact design or for compatibility with the existing layout of a stack.

This example alternately aligns and misaligns the transistor bodies. The alignment may be defined with respect to vertical centerlines of the transistor bodies and VBLs. For example, a centerline CL5a of a transistor body B4a is misaligned with a centerline CL1a of VBL1, a centerline CL6a of a transistor body B4b is aligned with a centerline CL2a of VBL2, a centerline CL7a of a transistor body B4c is aligned with a centerline CL3a of VBL3, and a centerline CL8a of a transistor body B4d is misaligned with a centerline CL4a of VBL4. A conductive path exists between a transistor body and the associated VBL above it due to the overlap, whether it is a full overlap in the case of an alignment or a partial overlap in the case of a misalignment.

In this example, a first vertical channel transistor body (B4a) is misaligned with a first vertical bit line (VBL1), and a second vertical channel transistor body (B4b) is aligned with a second vertical bit line (VBL2). Further, a third vertical channel transistor body (B4c) is aligned with a third vertical bit line (VBL3), and a fourth vertical channel transistor body (B4d) is misaligned with a fourth vertical bit line (VBL4).

Figure 6B:
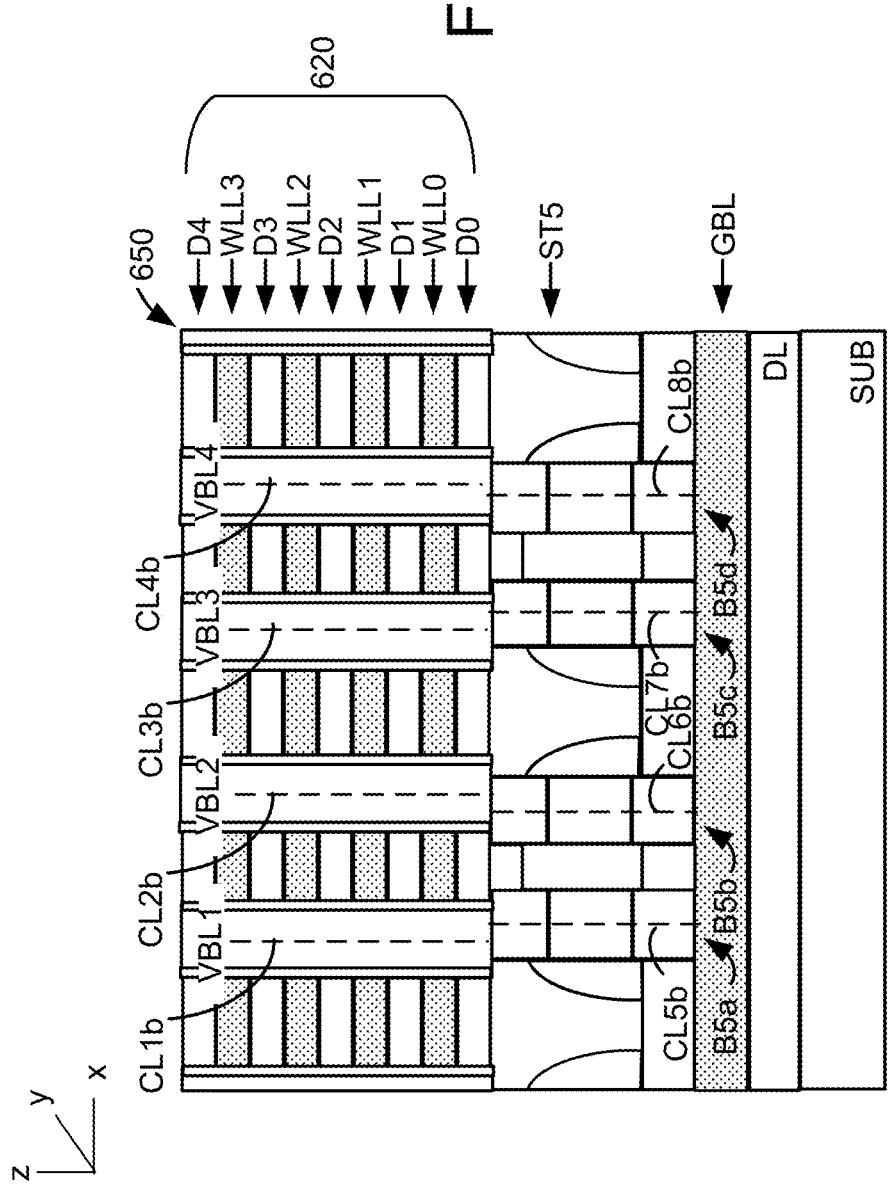
FIG. 6B depicts a memory device in which selection transistors are misaligned with vertical bit lines.

FIG. 6B depicts a memory device in which selection transistors are misaligned with vertical bit lines. In this case, an equal amount of partial overlap is provided from each transistor body and associated VBL. For example, a centerline CL5b of a transistor body B5a is misaligned with a centerline CL1b of VBL1, a centerline CL6b of a transistor body B5b is misaligned with a centerline CL2b of VBL2, a centerline CL7b of a transistor body B5c is misaligned with a centerline CL3b of VBL3, and a centerline CL8b of a transistor body B5d is misaligned with a centerline CL4b of VBL4. A conductive path exists between a transistor body and the associated VBL above it due to the partial overlap.

In this example, a first vertical channel transistor body (B5a) is misaligned with the first vertical bit line (VBL1), and a second vertical channel transistor body (B5b) is misaligned with the second vertical bit line (VBL2). Similarly, a third vertical channel transistor body (B5c) is misaligned with the third vertical bit line (VBL3), and a fourth vertical channel transistor body (B5d) is misaligned with the fourth vertical bit line (VBL4).

FIG. 7A depicts a process for fabricating a memory device such as in FIG. 2A to 6B. Step 700 includes forming horizontal bit lines (e.g., global bit lines) on a substrate. A bit line is a conductive line. See, e.g., FIG. 9A-9E. Step 701 includes forming transistor bodies on the horizontal bit lines. See, e.g., FIG. 10A-20E. Step 702 includes depositing a gate oxide. See, e.g., FIG. 21A-24E. Step 703 includes depositing a gate conductor material over the transistor bodies. See, e.g., FIG. 26A-26E. Step 704 includes etching the gate conductor material to form control gates, including shared and non-shared control gates. See, e.g., FIG. 27A-27E. Step 705 includes depositing insulation. See, e.g., FIG. 28A-28E. Step 706 includes forming a three-dimensional memory structure (e.g., a stack) above the transistors. See, e.g., FIG. 29A-29E.

FIG. 7B depicts a process for performing step 706 of FIG. 7A. Step 710 includes depositing alternating dielectric and conductive layers in a stack (see FIG. 2B). Step 711 includes etching trenches in the stack (see FIG. 2C). Step 712 includes depositing memory film in the trenches, coating sidewalls of the trenches (see FIG. 2C). Step 713 includes etching through the bottom of the memory film.

Step 714 includes depositing a vertical bit line material in the trenches, contacting a top of each transistor body. Step 715 includes removing portions of the memory film and vertical bit line material to create voids and depositing an insulating filler in the voids (see FIG. 2D).

In one aspect, a method for fabricating a semiconductor device comprises: forming a first horizontal bit line (GBL1) on a substrate (SUB); forming first (B1b, 2001), second (B1c, 2002) and third (B1d, 2003) vertical channel transistor bodies on the first horizontal bit line (see FIGS. 5A and 25B); depositing a gate conductor material (2601, FIG. 26B) around and over the first, second and third vertical channel transistor bodies, the gate conductor material filling a space (2502, FIGS. 25B and 26B) between the second and third vertical channel transistor bodies; and forming first (CG3a), second (CG3b), third (CG3c), fourth (CG3d) and fifth (CG3e) control gates from the gate conductor material, where the first control gate is a control gate of the first vertical channel transistor body and is not shared with any other vertical channel transistor body which is arranged along the first horizontal bit line, the second control gate is another control gate of the first vertical channel transistor body and is shared with the second vertical channel transistor body, and the third control gate is another control gate of the second vertical channel transistor body and is not shared with any other vertical channel transistor body which is arranged along the first horizontal bit line. Further, the fourth control gate is a control gate of the third vertical channel transistor body and is not shared with any other vertical channel transistor body which is arranged along the first horizontal bit line, the fifth control gate is another control gate of the third vertical channel transistor body and is shared with the fourth vertical channel transistor body, and the sixth control gate is another control gate of the fourth vertical channel transistor body and is not shared with any other vertical channel transistor body which is arranged along the first horizontal bit line.

In another aspect, the forming the first, second, third, fourth and fifth control gates comprises concurrently etching the gate conductor material between the first and second vertical channel transistor bodies and the gate conductor material in the space between the second and third vertical channel transistor bodies down to a substantially common height (see FIGS. 5A and 27B, height h).

In another aspect, the method further comprises: forming a three-dimensional memory structure (410, 510, 610, 620, 2901) above the first, second and third vertical channel transistor bodies, the three-dimensional memory structure comprising first (VBL1), second (VBL2) and third (VBL3) vertical bit lines, memory cells (MC2a) arranged along the first vertical bit line, memory cells (MC2b) arranged along the second vertical bit line and memory cells (MC2c) arranged along the third vertical bit line, where the first vertical channel transistor body is arranged between the first horizontal bit line (GBL1) and the first vertical bit line, the second vertical channel transistor body is arranged between the first horizontal bit line and the second vertical bit line, and the third vertical channel transistor body is arranged between the first horizontal bit line and the third vertical bit line.

In another aspect, the first, second and third vertical channel transistor bodies comprise first, second and third pillars, respectively, which are over the first horizontal bit line and under the first, second and third vertical bit lines, respectively.

Figure 7C:
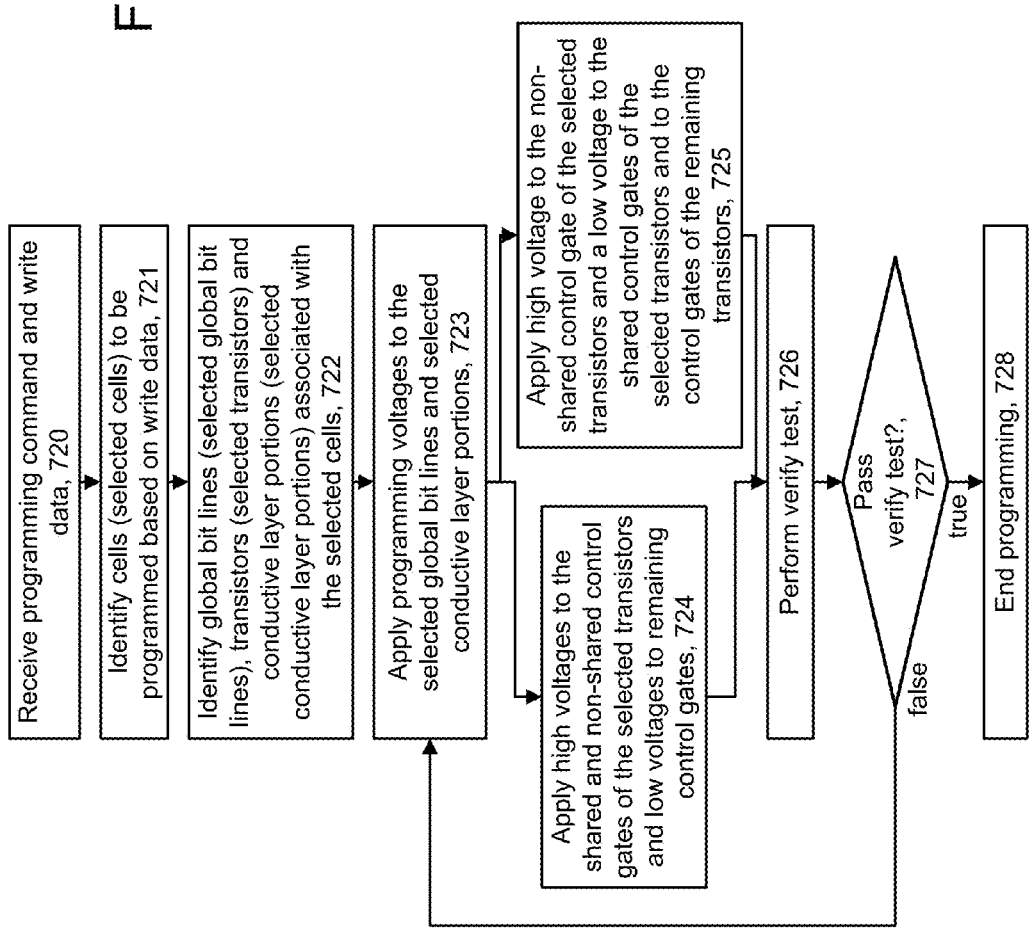
FIG. 7C depicts a programming process such as for the memory devices of 5A to 6B.

FIG. 7C depicts a programming process such as for the memory devices of 5A to 6B. A programming process can include a set or a reset process. Step 720 includes receiving a programming command and associated write data. Step 721 includes identifying cells (selected cells) to be programmed based on the write data. For example, this can include reading the cells to determine their current state. If the current state of a cell matches the write data, the cell is not programmed. If the current state of a cell does not match the write data, the cell is selected to be programmed. Step 722 includes identifying global bit lines (selected global bit lines), transistors (selected transistors) and conductive layer portions (selected conductive layer portions) associated with the selected cells. Step 723 includes applying programming voltages to the selected global bit lines and selected conductive layer portions. At the same time as step 723, step 724 or 725 is performed. Step 724 applies high voltages to the shared and non-shared control gates of the selected transistors and low voltages to the remaining, unselected transistors. A high voltage results in a channel while a low voltage does not result in a channel. In this approach, the transistor body of each selected transistor will have two channels so that programming can occur relatively quickly.

An alternative approach at step 725 applies a high voltage to the non-shared control gate of the selected transistors and a low voltage to the shared control gates of the selected transistors and to the control gates of the remaining, unselected transistors. In this approach, the transistor body of each selected transistor will have one channel so that programming may occur relatively slowly.

Step 726 involves performing a verify test. This can include sensing (reading) the selected cells to determine whether they have been programmed according to the write data. If all, or nearly all, of the cells have completed programming, the programming operation ends at step 728. If decision step 727 is false, another program-verify cycle occurs at step 723. A decision can be made to use step 724 or 725 for each program-verify cycle. In one approach, step 725 is initially used and, if the programming progress is too slow, step 724 is used to deliver a larger amount of current to the selected cells. For example, the programming progress can determine whether programming has been completed by a specified program-verify cycle, or whether a specified number of cells have completed programming after a specified program-verify cycle. An advantage of this approach is that inadvertent programming, as discussed previously, can be avoided or minimized. In another approach, step 724 but not step 725 is used for each program-verify cycle.

Referring also to FIG. 5A-5C, in one aspect, a method for programming in a three-dimensional memory structure (510), comprises: supplying a voltage to a first horizontal bit line (GBL1) on a substrate (SUB), (a) the three-dimensional memory structure is above the first horizontal bit line, the three-dimensional memory structure comprising first (VBL1) and second (VBL2) vertical bit lines, memory cells (MC2a) arranged along the first vertical bit line and memory cells (MC2b) arranged along the second vertical bit line, (b) a first selection transistor is arranged between the first horizontal bit line and the first vertical bit line, the first selection transistor comprises a first vertical channel transistor body (B1a), a first control gate (CG3a) and a second control gate (CG3b), and the first control gate is not shared with any other vertical channel transistor body which is arranged along the first horizontal bit line, and (c) a second selection transistor (TR3b) is arranged between the first horizontal bit line and the second vertical bit line, the second selection transistor comprises a second vertical channel transistor body (B1b), the second control gate as a shared control gate which is shared with the first selection transistor, and a third control gate (CG3c), the third control gate is not shared with any other vertical channel transistor body which is arranged along the first horizontal bit line; and during the supplying the voltage to the first horizontal bit line, supplying a voltage to the first control gate which is sufficient to form a conductive channel (Ch3a) through the first vertical channel transistor body as part of one conductive path (I1) between the first horizontal bit line and the first vertical bit line.

In another aspect, the method includes, during the supplying the voltage to the first control gate and the supplying the voltage to the first horizontal bit line: initially supplying a voltage to the second control gate which is insufficient to form a conductive channel through either of the first and second vertical channel transistor bodies; determining a programming progress of one or more memory cells of the memory cells arranged along the first vertical bit line; and based on the programming progress, supplying a voltage to the second control gate which is sufficient to form another conductive channel (Ch3b) through the first vertical channel transistor body as part of another conductive path (I1) between the first horizontal bit line and the first vertical bit line. For example, the programming progress can be determined at step 727 based on a verify test.

In another aspect, the method includes, during the supplying the voltage to the first control gate and the supplying the voltage to the first horizontal bit line: supplying a voltage to the third control gate (CG3c) which is insufficient to form a conductive channel through the second vertical channel transistor body.

In another aspect, the method includes, during the supplying the voltage to the first control gate and the supplying the voltage to the first horizontal bit line: supplying a voltage to the second control gate (CG3b) which is insufficient to form a conductive channel through either of the first (B1a) and second (B1b) vertical channel transistor bodies.

In another aspect, the method includes, during the supplying the voltage to the first control gate and the supplying the voltage to the first horizontal bit line: supplying a voltage to the second control gate (CG3b) which is sufficient to form another conductive channel (Ch3b) through the first vertical channel transistor body as part of another conductive path (I2) between the first horizontal bit line and the first vertical bit line.

In another aspect, the programming comprises programming one or more of the memory cells (MC2a) arranged along the first vertical bit line without programming one or more of the memory cells (MC2b) arranged along the second vertical bit line.

In another aspect, the three-dimensional memory structure comprises alternating conductive layers and dielectric layers arranged along the first and second vertical bit lines; and the method further comprises, during the supplying the voltage to the first control gate and the supplying the voltage to the first horizontal bit line: supplying a voltage to one or more of the conductive layers (CP2b).

Figure 8:
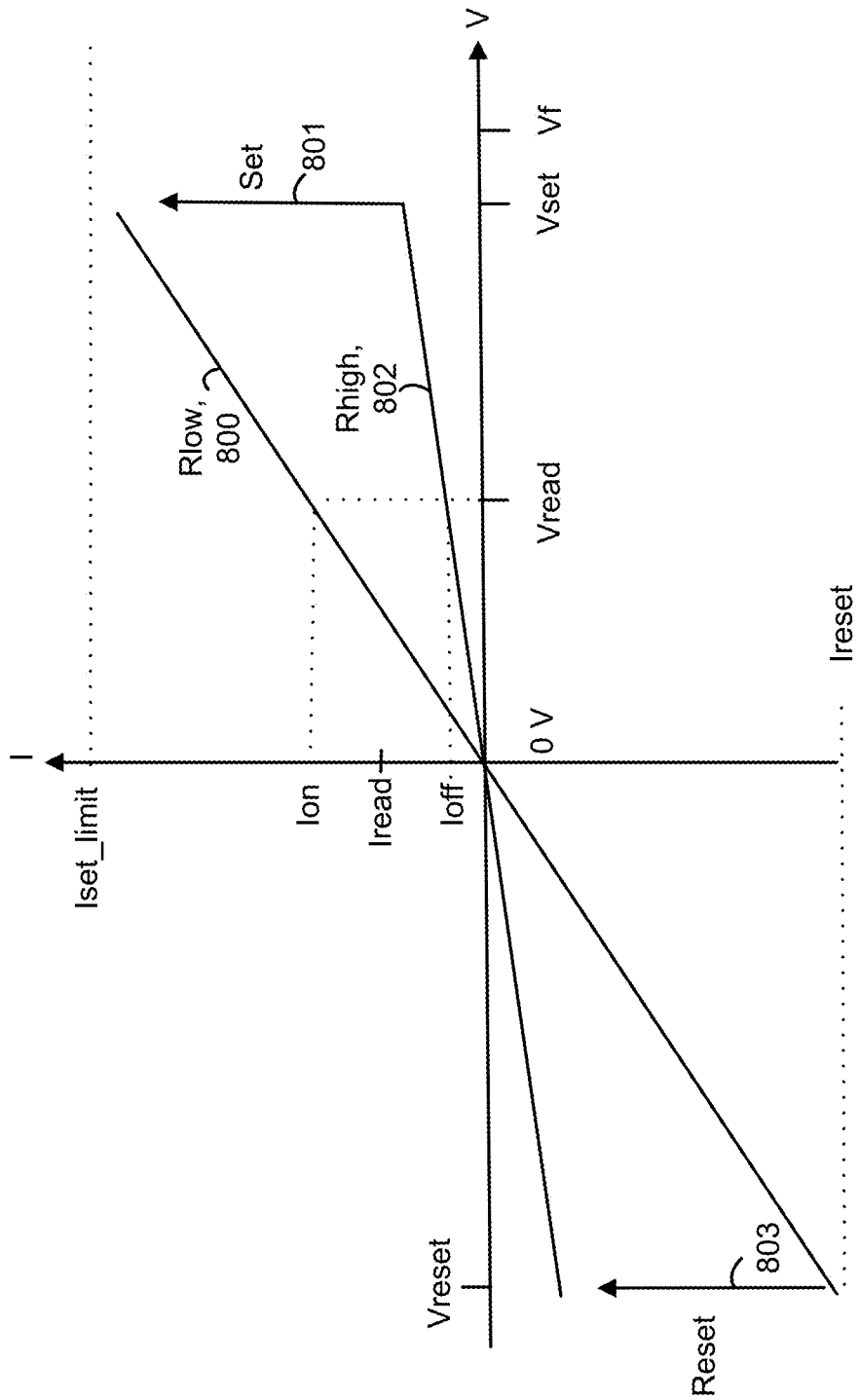
FIG. 8 is a graph depicting I-V characteristics of an example bipolar resistance-switching material which sets using a positive voltage.

FIG. 8 is a graph depicting I-V characteristics of an example bipolar resistance-switching material which sets using a positive voltage. As mentioned, a memory cell can be programmed to store data in a high resistance state (having a resistance Rhigh, which is relatively higher than a resistance Rlow of a low resistance state) or a low resistance state (having a resistance of Rlow which relatively lower than Rhigh). A programming operation can involve applying a voltage across a memory cell which results in a current through the memory cell. One example of a memory cell uses a bipolar resistance-switching material which sets using a positive voltage.

In this case, the set process (a transition from Rhigh to Rlow) occurs when a positive voltage is applied, and the reset process (a transition from Rlow to Rhigh) occurs when a negative voltage is applied. Line 802 represents the I-V characteristic when in the high-resistivity (Rhigh) state and line 800 represents a transition to the low-resistivity (Rlow) state. Line 801 represents the set process and line 803 represents the reset process.

A read voltage Vread is also depicted. To determine the state of the resistance-switching material, Vread is applied across the resistance-switching material while the resulting current is measured and compared to a reference or trip current Iread. A higher or lower measured current (Ion or Ioff, respectively) indicates that the resistance-switching material is in the low or high resistance state, respectively. For example, if Ioff<Iread is measured, the material is in the high resistance state. If Ion>Iread is measured, the material is in the low resistance state. A forming voltage Vf is also depicted.

The state of a memory cell may be determined in connection with a verify test of a programming operation (see step 726 of FIG. 7C) to determine if the state is consistent with write data in which case the cell is not programmed, or if the state is inconsistent with write data in which case the cell is programmed.

A current limit Iset_limit for a current through the memory cell can be enforced during a set process.

Alternatively, the memory cell has a bipolar resistance-switching material which sets using a negative voltage. In another possible option, the memory cell has a unipolar resistance-switching material.

FIG. 9A to 29E depicts an example of a fabrication process consistent with FIG. 7A. Each step can occur in the same sequence of the figures, in one approach.

FIG. 9A depicts a top view of a semiconductor material in a first step of a fabrication process, and FIGS. 9B, 9C, 9D and 9E depict views along cross-sections A-A', B-B', C-C' and D-D', respectively, of FIG. 9A.

FIG. 9A depicts formation of the global bit lines. Conductive lines 901a, 901b and 901c (e.g., global bit lines) are formed. The conductive lines can extend horizontally and parallel to one another, for example. The conductive lines may be formed of a metal such as Tungsten. As mentioned in connection with FIG. 5A, the horizontal bit lines may be provided on a dielectric layer above a silicon substrate. An insulating material 902a and 902b such as $SiO_2$ can be provided in the spaces between the horizontal bit lines.

FIG. 9B shows the horizontal bit line 901b, also referred to as global bit line.

FIG. 9C shows the insulating material 902b.

FIG. 9D shows a cross-section of the horizontal bit lines and the insulating material.

FIG. 9E shows a cross-section which is the same as FIG. 9D.

FIG. 10A depicts a top view of a semiconductor material in a next step of the fabrication process, and FIGS. 10B, 10C, 10D and 10E depict views along cross-sections A-A', B-B', C-C' and D-D', respectively, of FIG. 10A.

FIG. 10A depicts the semiconductor material after a first reactive ion etch of vertical thin film transistor layers. Several thin film transistor layers are deposited on the semiconductor material of FIG. 9A. After the deposition, the portions of the layers above the SiO 902a and 902b are etched away, so that the top view shows SiN regions 1001a, 1001b and 1001c separated by SiO regions 902a and 902b.

FIG. 10B shows the several layers that are deposited. These include an n+ polysilicon layer 1002, an n− polysilicon layer 1003, a p− polysilicon layer 1004, an n− polysilicon layer 1005, an n+ polysilicon layer 1006 and a dielectric layer such as an SiN layer 1001b.

FIG. 10C is the same as FIG. 9C and shows a cross-section of the horizontal bit lines and the insulating material. This view indicates that portions of the thin film transistor layers which are above the insulating material are etched away.

FIG. 10D shows raised structures 1010a, 1010b and 1010c which are formed above the horizontal conductive layers. The SiN regions 1001a, 1001b and 1001c are also depicted.

FIG. 10E shows a cross-section which is the same as FIG. 10D.

FIG. 11A depicts a top view of a semiconductor material in a next step of the fabrication process, and FIGS. 11B, 11C, 11D and 11E depict views along cross-sections A-A', B-B', C-C' and D-D', respectively, of FIG. 11A.

FIG. 11A depicts the semiconductor material after a gap fill process and chemical-mechanical polishing (CMP). A dielectric 1101a and 1101b such as SiO is deposited to fill the gaps between the raised structures. For example, the gaps may be over filled with SiO, after which CMP is performed to planarize the semiconductor material.

FIG. 11B is the same as FIG. 10B.

FIG. 11C shows the deposited SiO 1101b.

FIG. 11D shows the deposited SiO between the raised structures 1010a, 1010b and 1010c.

FIG. 11E shows a cross-section which is the same as FIG. 11D.

FIG. 12A depicts a top view of a semiconductor material in a next step of the fabrication process, and FIGS. 12B, 12C, 12D and 12E depict views along cross-sections A-A', B-B', C-C' and D-D', respectively, of FIG. 12A.

FIG. 12A depicts the semiconductor material after a hard mask deposition. A layer of SiN 1201, a layer of SiO2 1202 and a layer of a-Si 1203 (amorphous silicon) may be provided as hard masks.

FIG. 12B shows that an SiN layer 1201 is deposited over the SiN layer 1001b, followed by the SiO layer 1202 and the a-Si layer 1203. An alternative to the layers 1201-1203 is a layer of Dielectric Anti-Reflective Coating (DARC) and an organic hard mask such as amorphous carbon. One example of amorphous carbon is Advanced Patterning Film (APF) available from Applied Materials Inc., Santa Clara, Calif.

FIG. 12C depicts the semiconductor material of FIG. 11C with the hard mask layers.

FIG. 12D shows the hard mask layers above the raised structures.

FIG. 12E shows a cross-section which is the same as FIG. 12D.

FIG. 13A depicts a top view of a semiconductor material in a next step of the fabrication process, and FIGS. 13B, 13C, 13D and 13E depict views along cross-sections A-A', B-B', C-C' and D-D', respectively, of FIG. 13A.

FIG. 13A depicts the semiconductor material after lithography. One or more mask layers such as photoresist (resist) and Bottom Anti-Reflective Coating (BARC) are provided above the semiconductor material and patterned to form photoresist and BARC portions 1301a and 1301b above the a-Si layer 1203.

FIG. 13B depicts the photoresist and BARC portions 1301a and 1301b along line B-B'.

FIG. 13C depicts the photoresist and BARC portions along line B-B'.

FIG. 13D depicts the photoresist and BARC portion 1301a along line C-C'.

FIG. 13E depicts a cross-section in which the photoresist and BARC are not present.

FIG. 14A depicts a top view of a semiconductor material in a next step of the fabrication process, and FIGS. 14B, 14C, 14D and 14E depict views along cross-sections A-A', B-B', C-C' and D-D', respectively, of FIG. 14A.

FIG. 14A depicts the semiconductor material after a slimming reactive ion etch. Unequal spaces can be formed between the photoresist and BARC portions by tuning the amount of slimming. The slimming reduces the width of the photoresist and BARC portions. This top view shows the slimmed photoresist and BARC portions 1301as and 1301bs alternating with a-Si layer portions 1203a, 1203b and 1203c.

FIG. 14B depicts a view corresponding to FIG. 13B after the slimming.

In FIG. 14C, the cross-section of the photoresist and BARC portions is the same as in FIG. 14B.

FIG. 14D depicts the slimmed photoresist and BARC portion 1301as.

FIG. 14E depicts a cross-section in which the photoresist and BARC are not present.

FIG. 15A depicts a top view of a semiconductor material in a next step of the fabrication process, and FIGS. 15B, 15C, 15D and 15E depict views along cross-sections A-A', B-B', C-C' and D-D', respectively, of FIG. 15A.

FIG. 15A depicts the semiconductor material after deposition of a spacer such as an ultra low temperature (ULT) oxide which is formed in a temperature range of 75° C. to 100° C. The oxide includes portions 1501a, 1501b and 1501c.

FIG. 15B depicts the ULT oxide portions covering the photoresist and BARC portion 1301as and 1301bs.

In FIG. 15C, the cross-section of the ULT oxide, photoresist and BARC portions is the same as in FIG. 15B.

In FIG. 15D, the ULT oxide portion 1501a is above the photoresist and BARC portion 1301as.

In FIG. 15E, the ULT oxide portion 1501a is visible.

FIG. 16A depicts a top view of a semiconductor material in a next step of the fabrication process, and FIGS. 16B, 16C, 16D and 16E depict views along cross-sections A-A', B-B', C-C' and D-D', respectively, of FIG. 16A.

FIG. 16A depicts the semiconductor material after a reactive ion etch of the spacer (e.g., ULT oxide). The etch results in a planar surface for the slimmed photoresist and BARC portion 1301as and 1301bs, and the ULT oxide portions 1501a1, 1501a2, 1501b1 and 1501b2. The a-Si layer portion 1203b is also visible.

FIG. 16B depicts the planarity of the photoresist and BARC portion and the ULT oxide portions.

In FIG. 16C, the cross-section of the photoresist and BARC portions and the ULT oxide portions is the same as in FIG. 16B.

In FIG. 16D, the photoresist and BARC portion 1301as extends across the top of the semiconductor material.

In FIG. 16E, the ULT oxide portion 1501a2 extends across the top of the semiconductor material.

FIG. 17A depicts a top view of a semiconductor material in a next step of the fabrication process, and FIGS. 17B, 17C, 17D and 17E depict views along cross-sections A-A', B-B', C-C' and D-D', respectively, of FIG. 17A.

FIG. 17A depicts the semiconductor material after ashing of the photoresist and BARC material, leaving the ULT oxide portions 1501a1, 1501a2, 1501b1 and 1501b2. Note that unequal spaces between the ULT oxide portions can be formed. The ULT oxide portions alternate with a-Si layer portions 1203a1, 1203b and 1203c1.

FIG. 17B depicts the unequal spaces between the ULT oxide portions. The transistor bodies are ultimately formed under the ULT oxide portions, so this is the spacing between the transistor bodies.

In FIG. 17C, the cross-section of the ULT oxide portions is the same as in FIG. 17B.

In FIG. 17D, the photoresist and BARC portion 1301as of FIG. 16D has been removed.

In FIG. 17E, the ULT oxide portion 1501a2 extends across the top of the semiconductor material.

FIG. 18A depicts a top view of a semiconductor material in a next step of the fabrication process, and FIGS. 18B, 18C, 18D and 18E depict views along cross-sections A-A', B-B', C-C' and D-D', respectively, of FIG. 18A.

FIG. 18A depicts the semiconductor material after a reactive ion etch of the a-Si. In this top view, SiO layer portions 1202a, 1202b and 1202c (see also FIG. 12B) are visible. These portions alternate with the ULT oxide portions 1501a1, 1501a2, 1501b1 and 1501b2.

FIG. 18B depicts a-Si layer portions 1203f, 1203g and 1203h under the ULT oxide portions. The ULT oxide portions acts as a mask to etch the a-Si layer, and the etch stops at the SiO layer 1202.

In FIG. 18C, the cross-section of the ULT oxide portions and a-Si portions is the same as in FIG. 18B.

FIG. 18D corresponds to FIG. 17D but does not include the a-Si layer 1203.

FIG. 18E is the same as FIG. 17E.

FIG. 19A depicts a top view of a semiconductor material in a next step of the fabrication process, and FIGS. 19B, 19C, 19D and 19E depict views along cross-sections A-A', B-B', C-C' and D-D', respectively, of FIG. 19A.

FIG. 19A depicts the semiconductor material after a reactive ion etch of the hard mask layers and SiO layers down to the SiN layer 1201. In this view, SiN portions 1201a, 1201b and 1201c are visible and alternate with the a-Si layer portions 1203f, 1203g, 1203h and 1203i.

FIG. 19B depicts SiO layer portions 1202d, 1202e and 1202f below the a-Si layer portions 1203f, 1203g and 1203h, respectively.

In FIG. 19C, the cross-section of the SiO layer portions and the a-Si layer portion is obtained after the cross-section of FIG. 18C.

FIG. 19D is the same as FIG. 18D except that a portion of the SiO layer 1202 has been removed so that the SiN layer 1201 is exposed.

FIG. 19E depicts the a-Si layer portion 1203g on the SiO layer portion 1202e on the SiN layer 1201.

FIG. 20A depicts a top view of a semiconductor material in a next step of the fabrication process, and FIGS. 20B, 20C, 20D and 20E depict views along cross-sections A-A', B-B', C-C' and D-D', respectively, of FIG. 20A.

FIG. 20A depicts the semiconductor material after a second reactive ion etch of vertical thin film transistor layers. The etch proceeds down to the GBL 901b. The etch removes the a-Si layer portions 1203f, 1203g, 1203h and 1203i and part of the SiO layer portions 1202d, 1202e, 1202f and 1202g resulting in reduced SiO layer portions 1202d1, 1202e1, 1202f1 and 1202g1, respectively.

FIG. 20B depicts structures 2001, 2002 and 2003 which are formed by the etching. The reduced SiO layer portions 1202d1, 1202e1 and 1202f1 are on top of the structures.

FIG. 20C depicts raised structures along line B-B'.

FIG. 20D depicts alternating global bit lines and insulating material, similar to FIG. 9D.

FIG. 20E depicts portions of the thin film transistor layers which were not removed by the etching.

FIG. 21A depicts a top view of a semiconductor material in a next step of the fabrication process, and FIGS. 21B, 21C, 21D and 21E depict views along cross-sections A-A', B-B', C-C' and D-D', respectively, of FIG. 21A.

FIG. 21A depicts the semiconductor material after a SiN liner 2101 deposition.

In FIG. 21B, the liner 2101 extends over the structures 2001, 2002 and 2003.

FIG. 21C corresponds to the view of FIG. 20C with the addition of the SiN liner 2101.

FIG. 21D is the same as FIG. 20D except for the addition of the liner above the alternating global bit lines and insulating material.

FIG. 21E is the same as FIG. 20E except for the addition of the liner at the top of the structure.

FIG. 22A depicts a top view of a semiconductor material in a next step of the fabrication process, and FIGS. 22B, 22C, 22D and 22E depict views along cross-sections A-A', B-B', C-C' and D-D', respectively, of FIG. 22A.

FIG. 22A depicts the semiconductor material after a gap fill and CMP process. The gaps between the structures 2001, 2002 and 2003 are filled with an insulation such as SiO. CMP is then performed to provide a planar surface for the semiconductor material. This top view shows SiN regions 1001d, 1001e, 1001f and 1001g alternating with SiO regions 2201a, 2201b and 2201c.

FIG. 22B depicts the SiO between the structures 2001, 2002 and 2003.

FIG. 22C depicts the SiO along line B-B'.

FIG. 22D depicts the SiO 2201a above the alternating global bit lines and insulating material.

FIG. 22E is similar to FIG. 21E except for the removal of the SiN liner 2101 and the SiO layer portions.

FIG. 23A depicts a top view of a semiconductor material in a next step of the fabrication process, and FIGS. 23B, 23C, 23D and 23E depict views along cross-sections A-A', B-B', C-C' and D-D', respectively, of FIG. 23A.

FIG. 23A depicts the semiconductor material after a SiO recess etch back. The gap fill material (SiO) is etched down to a level which is close to the global bit line 901b, forming reduced SiO regions 2201a1, 2201b1 and 2201c1 adjacent to the structures 2001, 2002 and 2003. The height of the SiO after etching sets the height of the bottom of the control gates of the transistors.

FIG. 23B depicts the height of the SiO regions 2201a1, 2201b1 and 2201c1. The SiN liner 2101a is also depicted.

FIG. 23C also depicts the height of the SiO regions.

FIG. 23D depicts the SiO region 2201a1.

FIG. 23E depicts the same structure as in FIG. 22E.

FIG. 24A depicts a top view of a semiconductor material in a next step of the fabrication process, and FIGS. 24B, 24C, 24D and 24E depict views along cross-sections A-A', B-B', C-C' and D-D', respectively, of FIG. 24A.

FIG. 24A depicts the semiconductor material after removal of the SiN liner.

FIG. 24B depicts the same structure as in FIG. 23B except for the removal of the SiN liner.

FIG. 24C depicts the same structure as in FIG. 23C except for the removal of the SiN liner.

FIG. 24D depicts the same structure as in FIG. 23D.

FIG. 24E depicts the same structure as in FIG. 23E.

FIG. 25A depicts a top view of a semiconductor material in a next step of the fabrication process, and FIGS. 25B, 25C, 25D and 25E depict views along cross-sections A-A', B-B', C-C' and D-D', respectively, of FIG. 25A.

FIG. 25A depicts the semiconductor material after gate oxidation. A gate oxide layer 2501 is used as a spacer between the transistor bodies and the control gates. This top view shows a blanket layer of oxide.

FIG. 25B depicts the gate oxide on the sidewalls of the structures 2001, 2002 and 2003. The structures are transistor bodies. A space 2502 exists between the structures 2002 and 2003.

FIG. 25C depicts the gate oxide on SiO.

FIG. 25D depicts the same structure as in FIG. 24D except for the addition of the gate oxide.

FIG. 25E depicts the same structure as in FIG. 24E except for the addition of the gate oxide.

FIG. 26A depicts a top view of a semiconductor material in a next step of the fabrication process, and FIGS. 26B, 26C, 26D and 26E depict views along cross-sections A-A', B-B', C-C' and D-D', respectively, of FIG. 26A.

FIG. 26A depicts the semiconductor material after deposition of a gate conductor material 2601. The gate conductor material forms the control gates of the transistors.

FIG. 26B depicts the gate conductor material around and between the structures 2001, 2002 and 2003. The spacing between the structures 2001 and 2002 is wide enough so that the gate conductor material comprises vertical portions 2610 and 2611 along the sidewalls of the structures and a horizontal portion 2612 between the vertical portions. Thus, the gate conductor material conforms to the shape of the structures 2001 and 2002. However, the space 2502 between the structures 2002 and 2003 is narrow enough so that a vertical portion 2613 of the gate conductor material completely fills the space 2502 (FIG. 25B). The vertical portions 2610 and 2611 become non-shared control gates and the vertical portion 2613 becomes a shared control gate.

FIG. 26C depicts the gate conductor material along line B-B'.

FIG. 26D depicts the gate conductor material along line C-C'.

FIG. 26E depicts the gate conductor material along line D-D'.

FIG. 27A depicts a top view of a semiconductor material in a next step of the fabrication process, and FIGS. 27B, 27C, 27D and 27E depict views along cross-sections A-A', B-B', C-C' and D-D', respectively, of FIG. 27A.

FIG. 27A depicts the semiconductor material after etch back of the gate conductor material. The etch back removes the horizontal portion 2612 and concurrently reduces the height of the vertical portions 2610, 2611 and 2613. Control gates 2601a, 2601b, 2601c and 2601d are formed.

FIG. 27B depicts the height of the gate conductor material after the etch back. This is the height (h) of the control gates, consistent with the height depicted in FIG. 5A. The control gates 2601a, 2601b and 2601d are non-shared control gates and the control gate 2601c is a shared control gate.

FIG. 27C depicts a view of the gate conductor material along line B-B'.

FIG. 27D depicts a view of the gate conductor material 2601b along line C-C'.

FIG. 27E depicts a view of the semiconductor material along line D-D'.

FIG. 28A depicts a top view of a semiconductor material in a next step of the fabrication process, and FIGS. 28B, 28C, 28D and 28E depict views along cross-sections A-A', B-B', C-C' and D-D', respectively, of FIG. 28A.

FIG. 28A depicts the semiconductor material after a gap fill and CMP. An insulating material such as SiO can be deposited to fill the gaps between the non-shared control gates. The top view depicts SiO portions 2801a, 2801b and 2801c.

FIG. 28B depicts the SiO portion 2801a between structures 2001 and 2002, and the SiO portion 2801b between structures 2002 and 2003. Each structure comprises a number of layers. For example, the structure 2003 includes layers 1002a (n+ polysilicon), 1003a (n-polysilicon), 1004a (p- polysilicon), 1005a (n- polysilicon), 1006a (n+ polysilicon), 1001b1 (SiN) and 1201a (SiN). Example control gates 2811, 2812 and 2813 are also depicted.

FIG. 28C depicts a view along line B-B'.

FIG. 28D depicts the SiO portion 2801a above the control gate 2601b.

FIG. 28E is the same as FIG. 27E.

FIG. 29A depicts a top view of a semiconductor material in a next step of the fabrication process, and FIGS. 29B, 29C, 29D and 29E depict views along cross-sections A-A', B-B', C-C' and D-D', respectively, of FIG. 29A.

FIG. 29A depicts the semiconductor material after the formation of a stack 2901. In the stack, portions 2906a, 2906b and 2906c comprise alternating conductive layers and dielectric layers. Vertical bit lines 2902a, 2902b and 2902c are provided between the portions 2906a, 2906b and 2906c. A bottom surface of each vertical bit line is connected to a top surface of a corresponding transistor body. Insulation regions 2907a and 2907b are also depicted.

In FIG. 29A, the topmost dielectric layer portions 2903a, 2903b or 2903c alternate with the vertical bit lines 2902a, 2902b and 2902c.

FIG. 29B depicts an example conductive layer portion 2904 below the dielectric layer portion 2903a. An example memory film 2905 is depicted. Before the stack is formed, a conductive adhesive material such as TiN 2910a is provided above the transistor bodies. For example, the SiN 1001b1 and SiN 1201a can be etched away to form voids into which TiN is deposited. A CMP process may then be used to planarize the semiconductor material to provide a base for fabricating the stack. A top surface of the TiN may contact a bottom surface of a corresponding vertical bit line. When the transistor body is aligned with the vertical bit line, the top surface may fully contact the bottom surface of the vertical bit line. When the transistor body is misaligned with the vertical bit line, as in FIG. 29B, the top surface may only partially contact the bottom surface of the vertical bit line.

Example control gates 2811, 2812, 2813 and 2814 are also depicted. An example transistor body may be formed from the layers 1002a-1006a. An associated example transistor may be formed from the transistor body and the control gates 2813 and 2814, which are separated from the body by a gate oxide layer.

FIG. 29C provides a view along line B-B'.

FIG. 29D provides a view along line C-C'.

FIG. 29E provides a view along line D-D'.

Accordingly, it can be seen that, in one embodiment, a semiconductor device comprises: a substrate; a first horizontal bit line on the substrate; a three-dimensional memory structure above the first horizontal bit line, the three-dimensional memory structure comprising first and second vertical bit lines, memory cells arranged along the first vertical bit line and memory cells arranged along the second vertical bit line; a first selection transistor arranged between the first horizontal bit line and the first vertical bit line, the first selection transistor comprises a first vertical channel transistor body, a first control gate and a second control gate, and the first control gate is not shared with any other vertical channel transistor body which is arranged along the first horizontal bit line; and a second selection transistor arranged between the first horizontal bit line and the second vertical bit line, the second selection transistor comprises a second vertical channel transistor body, the second control gate as a shared control gate which is shared with the first selection transistor, and a third control gate, the third control gate is not shared with any other vertical channel transistor body which is arranged along the first horizontal bit line.

In another embodiment, a method for programming in a three-dimensional memory structure comprises: supplying a voltage to a first horizontal bit line on a substrate, (a) the three-dimensional memory structure is above the first horizontal bit line, the three-dimensional memory structure comprising first and second vertical bit lines, memory cells arranged along the first vertical bit line and memory cells arranged along the second vertical bit line, (b) a first selection transistor is arranged between the first horizontal bit line and the first vertical bit line, the first selection transistor comprises a first vertical channel transistor body, a first control gate and a second control gate, and the first control gate is not shared with any other vertical channel transistor body which is arranged along the first horizontal bit line, and (c) a second selection transistor is arranged between the first horizontal bit line and the second vertical bit line, the second selection transistor comprises a second vertical channel transistor body, the second control gate as a shared control gate which is shared with the first selection transistor, and a third control gate, the third control gate is not shared with any other vertical channel transistor body which is arranged along the first horizontal bit line; and during the supplying the voltage to the first horizontal bit line, supplying a voltage to the first control gate which is sufficient to form a conductive channel through the first vertical channel transistor body as part of one conductive path between the first horizontal bit line and the first vertical bit line.

In another embodiment, a method for fabricating a semiconductor device comprises: forming a first horizontal bit line on a substrate; forming first, second and third vertical channel transistor bodies on the first horizontal bit line; depositing a gate conductor material around and over the first, second and third vertical channel transistor bodies, the gate conductor material filling a space between the second and third vertical channel transistor bodies; and forming first, second, third, fourth and fifth control gates from the gate conductor material, the first control gate is a control gate of the first vertical channel transistor body and is not shared with any other vertical channel transistor body which is arranged along the first horizontal bit line, the second control gate is another control gate of the first vertical channel transistor body and is shared with the second vertical channel transistor body, the third control gate is another control gate of the second vertical channel transistor body and is not shared with any other vertical channel transistor body which is arranged along the first horizontal bit line, the fourth control gate is a control gate of the third vertical channel transistor body and is not shared with any other vertical channel transistor body which is arranged along the first horizontal bit line, and the fifth control gate is another control gate of the third vertical channel transistor body.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A semiconductor device, comprising:
a substrate;
a first horizontal bit line on the substrate;
a three-dimensional memory structure above the first horizontal bit line, the three-dimensional memory structure comprising first and second vertical bit lines, memory cells arranged along the first vertical bit line and memory cells arranged along the second vertical bit line;
a first selection transistor arranged between the first horizontal bit line and the first vertical bit line, the first selection transistor comprises a first vertical channel transistor body, a first control gate and a second control gate, and the first control gate is not shared with any other vertical channel transistor body which is arranged along the first horizontal bit line;
a second selection transistor arranged between the first horizontal bit line and the second vertical bit line, the second selection transistor comprises a second vertical channel transistor body, the second control gate as a shared control gate which is shared with the first selection transistor, and a third control gate, the third control gate is not shared with any other vertical channel transistor body which is arranged along the first horizontal bit line;
in the three-dimensional memory structure, third and fourth vertical bit lines, memory cells arranged along the third vertical bit line and memory cells arranged along the fourth vertical bit line;
a second horizontal bit line spaced apart from the first horizontal bit line;
a third selection transistor arranged between the second horizontal bit line and the third vertical bit line, the third selection transistor comprises a first switchable conductive path between the second horizontal bit line and the third vertical bit line, the third selection transistor comprises a third vertical channel transistor body, a fourth control gate and a fifth control gate, the fourth control gate is not shared with any other vertical channel transistor body which is arranged along the second horizontal bit line, the first and fourth control gates are electrically connected and the second and fifth control gates are electrically connected; and
a fourth selection transistor arranged between the second horizontal bit line and the fourth vertical bit line, the fourth selection transistor comprises a second switchable conductive path between the second horizontal bit line and the fourth vertical bit line, the fourth selection transistor comprises a fourth vertical channel transistor body, the fifth control gate as a shared control gate which is shared with the third selection transistor, and a sixth control gate, the sixth control gate is not shared with any other vertical channel transistor body which is arranged along the second horizontal bit line, and the third and sixth control gates are electrically connected.

2. The semiconductor device of claim 1, wherein:
the first selection transistor comprises a first switchable conductive path between the first horizontal bit line and the first vertical bit line; and
the second selection transistor comprises a second switchable conductive path between the first horizontal bit line and the second vertical bit line.

3. The semiconductor device of claim 1, wherein:
the second control gate has a uniform height between the first and second vertical channel transistor bodies.

4. The semiconductor device of claim 3, wherein:
the first vertical channel transistor body comprises a first pillar which is over the first horizontal bit line and under the first vertical bit line; and
the second vertical channel transistor body comprises a second pillar which is over the first horizontal bit line and under the second vertical bit line.

5. The semiconductor device of claim 1, wherein:
the first vertical channel transistor body comprises a first middle region between source and drain regions;
the second vertical channel transistor body comprises a second middle region between source and drain regions;
the first control gate extends between the source and drain regions of the first vertical channel transistor body;
the second control gate extends between the source and drain regions of the first vertical channel transistor body and between the source and drain regions of the second vertical channel transistor body; and
the third control gate extends between the source and drain regions of the second vertical channel transistor body.

6. The semiconductor device of claim 1, wherein:
the first and second control gates are on opposite sides of the first vertical channel transistor body; and the second and third control gates are on opposite sides of the second vertical channel transistor body.

7. The semiconductor device of claim 1, wherein:
the three-dimensional memory structure comprises alternating conductive layers and dielectric layers arranged along the first and second vertical bit lines.

8. The semiconductor device of claim 7, wherein:
first and second memory films are arranged along the first and second vertical bit lines, respectively;
the memory cells arranged along the first vertical bit line are formed by portions of the first memory film which intersect with the conductive layers; and
the memory cells arranged along the second vertical bit line are formed by portions of the second memory film which intersect with the conductive layers.

9. The semiconductor device of claim 1, wherein:
the first vertical channel transistor body is misaligned with the first vertical bit line.

10. The semiconductor device of claim 1, wherein:
the first vertical channel transistor body is aligned with the first vertical bit line; and
the second vertical channel transistor body is aligned with the second vertical bit line.

11. The semiconductor device of claim 1, wherein:
the memory cells arranged along the first vertical bit line and the memory cells arranged along the second vertical bit line comprises resistance change memory cells.

12. The semiconductor device of claim 1, wherein:
the second vertical channel transistor body is misaligned with the second vertical bit line.

13. A semiconductor device, comprising:
a substrate;
a first horizontal bit line on the substrate;
a three-dimensional memory structure above the first horizontal bit line, the three-dimensional memory structure comprising first and second vertical bit lines, memory cells arranged along the first vertical bit line and memory cells arranged along the second vertical bit line;
a first selection transistor arranged between the first horizontal bit line and the first vertical bit line, the first selection transistor comprises a first vertical channel transistor body, a first control gate and a second control gate, and the first control gate is not shared with any other vertical channel transistor body which is arranged along the first horizontal bit line; and
a second selection transistor arranged between the first horizontal bit line and the second vertical bit line, the second selection transistor comprises a second vertical channel transistor body, the second control gate as a shared control gate which is shared with the first selection transistor, and a third control gate, the third control gate is not shared with any other vertical channel transistor body which is arranged along the first horizontal bit line, and the first vertical channel transistor body is misaligned with the first vertical bit line.

14. A semiconductor device, comprising:
a substrate;
a first horizontal bit line on the substrate;
a three-dimensional memory structure above the first horizontal bit line, the three-dimensional memory structure comprising first and second vertical bit lines, memory cells arranged along the first vertical bit line and memory cells arranged along the second vertical bit line;
a first selection transistor arranged between the first horizontal bit line and the first vertical bit line, the first selection transistor comprises a first vertical channel transistor body, a first control gate and a second control gate, and the first control gate is not shared with any other vertical channel transistor body which is arranged along the first horizontal bit line; and
a second selection transistor arranged between the first horizontal bit line and the second vertical bit line, the second selection transistor comprises a second vertical channel transistor body, the second control gate as a shared control gate which is shared with the first selection transistor, and a third control gate, the third control gate is not shared with any other vertical channel transistor body which is arranged along the first horizontal bit line, and the second vertical channel transistor body is misaligned with the second vertical bit line.

* * * * *